(12) United States Patent
Matsumura et al.

(10) Patent No.: US 8,089,093 B2
(45) Date of Patent: Jan. 3, 2012

(54) NITRIDE SEMICONDUCTOR DEVICE INCLUDING DIFFERENT CONCENTRATIONS OF IMPURITIES

(75) Inventors: Hiroaki Matsumura, Tokushima (JP); Keiji Sakamoto, Anan (JP); Tsuyoshi Hirao, Tokushima (JP)

(73) Assignee: Nichia Corporation, Anan-shi (JP)

( * ) Notice: Subject to any disclaimer, the term of this patent is extended or adjusted under 35 U.S.C. 154(b) by 0 days.

(21) Appl. No.: 11/061,785

(22) Filed: Feb. 22, 2005

(65) Prior Publication Data

US 2005/0184299 A1     Aug. 25, 2005

(30) Foreign Application Priority Data

Feb. 20, 2004   (JP) .................................. 2004-045168

(51) Int. Cl.
*H01L 33/00*     (2010.01)

(52) U.S. Cl. ............. 257/101; 257/79; 257/94; 257/102; 257/E33.025

(58) Field of Classification Search .......... 257/607–612, 257/917, 79, 94, 101–103, E33.025
See application file for complete search history.

(56) References Cited

U.S. PATENT DOCUMENTS

| | | | | |
|---|---|---|---|---|
| 6,069,394 A | * | 5/2000 | Hashimoto et al. | ........... 257/466 |
| 6,153,010 A | * | 11/2000 | Kiyoku et al. | ................. 117/95 |
| 6,172,382 B1 | * | 1/2001 | Nagahama et al. | ............. 257/94 |
| 6,455,877 B1 | | 9/2002 | Ogawa et al. | |
| 6,531,383 B1 | | 3/2003 | Lee | |
| 6,551,848 B2 | | 4/2003 | Kwak et al. | |
| 6,610,606 B2 | | 8/2003 | Sakai et al. | |
| 6,611,004 B2 | | 8/2003 | Morimoto | |
| 6,617,607 B2 | * | 9/2003 | Ito et al. | ........................... 257/22 |
| 6,657,237 B2 | | 12/2003 | Kwak et al. | |
| 2003/0082893 A1 | * | 5/2003 | Matsumoto et al. | .......... 438/522 |

FOREIGN PATENT DOCUMENTS

| | | |
|---|---|---|
| JP | 10-256660 A | 9/1998 |
| JP | 2001-274140 A | 10/2001 |
| JP | 2002-16312 A | 1/2002 |
| JP | 2002-57321 A | 2/2002 |
| JP | 2002-232003 A | 8/2002 |
| JP | 2002-261326 A | 9/2002 |
| JP | 2002-270525 A | 9/2002 |
| JP | 2002-270619 A | 9/2002 |
| JP | 2002-289591 A | 10/2002 |
| JP | 2003-51614 A | 2/2003 |
| JP | 2003-224298 A | 8/2003 |
| JP | 2003-229623 A | 8/2003 |
| JP | 2003-347660 A | 12/2003 |
| JP | 2004-6718 A | 1/2004 |

* cited by examiner

*Primary Examiner* — Matthew Landau
*Assistant Examiner* — Candice Chan
(74) *Attorney, Agent, or Firm* — Smith Patent Office

(57) ABSTRACT

A nitride semiconductor device having a substrate electrode establishing an excellent ohmic contact with a nitride semiconductor substrate is provided. The nitride semiconductor device includes a substrate having an electrode formed on at least one main surface. The substrate is a nitride semiconductor substrate whose surface includes two regions. The first region has an electrode formed thereon and a second region does not have any electrodes formed thereon. A first n-type impurity is included in a higher concentration in the first region than that in the second region in the vicinity of the surface of the substrate.

22 Claims, 11 Drawing Sheets

NITRIDE SEMICONDUCTOR DEVICE INCLUDING DIFFERENT CONCENTRATIONS OF IMPURITIES

BACKGROUND OF INVENTION

1. Field of the Invention

The present invention relates to a nitride semiconductor device and a manufacturing method of a nitride semiconductor substrate, and a manufacturing method of a nitride semiconductor device and more particularly, to a nitride semiconductor device and a nitride semiconductor having an electrode disposed thereon and method for manufacturing the same.

2. Discussion of the Related Art

Recently, nitride semiconductor substrates such as a GaN substrate have been manufactured and various methods for disposing an electrode on the nitride semiconductor substrates have been proposed. For example, a method which is characterized by using the active species in a dry-etching for removing a damaged area that occurred by a polishing treatment has been described in Japanese Patent Publication Nos. 2003-347660 and 2004-6718.

However, in a conventional method employing dry-etching, an electrode disposed on a substrate which has been subjected to an etching process can establish ohmic contact only after subjected to a heat treatment, and there have been problems in thermal stability and reliability. Also, in a non-alloy electrode which is not subjected to a heat treatment, it has been difficult to establish a sufficient ohmic contact. If the thermal stability of the substrate-side electrode is poor, the electrode characteristic deteriorates by a heat treatment when mounting the substrate-side of the electrode on a submount such as a heat sink. Therefore, it has been difficult to utilize a device having a counter electrode on the substrate. Also, heat generated during the operation causes deterioration in the ohmic characteristics and a decrease in reliability, and these problems hinder achieving a long life.

Therefore, the object of the present invention is to provide a nitride semiconductor device having a substrate electrode capable of establishing an excellent ohmic contact with a nitride semiconductor substrate. In the present specification, a substrate electrode means an electrode disposed on the substrate.

Another object of the present invention is to provide a highly reliable nitride semiconductor device having a non-alloy electrode which has excellent thermal stability and is capable of establishing an ohmic contact with the nitride semiconductor substrate without being alloyed.

SUMMARY OF THE INVENTION

To achieve the objects described above, a first nitride semiconductor device according to the present invention comprises a nitride semiconductor device which includes a substrate having an electrode disposed onto at least one main surface thereof, wherein the substrate is a nitride semiconductor substrate whose surface comprises a first region having an electrode formed thereon and a second region without having any electrodes formed thereon, and a first n-type impurity is included in a higher concentration in the first region than in the second region in the vicinity of the substrate surface.

A second nitride semiconductor device according to the present invention includes a substrate where an electrode is disposed onto at least one main surface. The substrate is a nitride semiconductor substrate where the first n-type impurity is included in a higher concentration in the vicinity of its surface than in a deeper portion thereof.

In the first and the second nitride semiconductor devices according to the present invention, it is preferable that the electrode has a first layer comprising at least a metal selected from the group consisting of vanadium (V), tungsten (W), molybdenum (Mo), chromium (Cr), zirconium (Zr), niobium (Nb), hafnium (Hf), tantalum (Ta), and titanium (Ti), as a layer which is in contact with the substrate.

The first and the second nitride semiconductor devices according to the present invention include a first n-type impurity in a higher concentration in the first region having the electrode disposed thereon and in the vicinity of the surface than in other portions. Thus, the nitride semiconductor device having the substrate electrode capable of establishing an excellent ohmic contact with the nitride semiconductor substrate can be provided.

Moreover, by forming the electrode with a first layer including at least one metal selected from the group consisting of vanadium (V), tungsten (W), molybdenum (Mo), chromium (Cr), zirconium (Zr), niobium (Nb), hafnium (Hf), tantalum (Ta), and titanium (Ti), as a layer contiguous to the substrate, a non-alloy electrode capable of establishing an ohmic contact with the nitride semiconductor substrate without being alloyed, and with excellent thermal stability can be obtained. Thus, a highly reliable nitride semiconductor device having a non-alloy electrode can be provided.

DETAILED DESCRIPTION OF THE PREFERRED EMBODIMENTS

Preferred embodiments and examples according to the present invention will now be described in detail below with reference to the accompanying drawings. However, the scope of the present invention is not construed to be limited by the embodiments and examples.

Embodiment 1

A substrate electrode structure according to Embodiment 1 of the present invention includes an electrode disposed on at least one main surface of a nitride semiconductor substrate, where the concentration of a first n-type impurity in the vicinity of the surface of one main surface is set to be larger than that in the deeper region.

As described above, in the substrate electrode structure according to Embodiment 1, the first n-type impurity is included in a high concentration in the vicinity of the surface of one main surface where an electrode is to be disposed thereon, and a low or no concentration of the first n-type impurity is included in other regions. For example, the low or no concentration area can include a deeper region which is close to the opposite main surface. With this arrangement, an excellent ohmic contact can be obtained and deterioration of crystallinity due to addition of an impurity can be prevented.

Figure 1A:
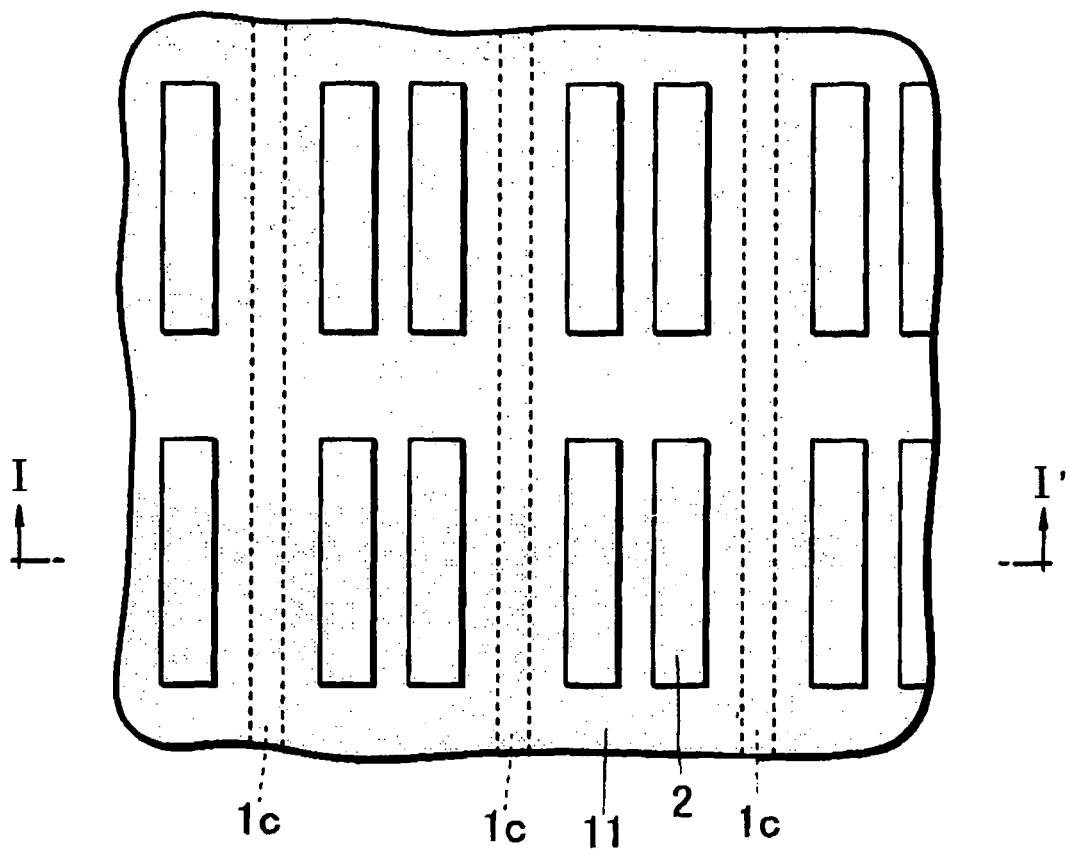
FIG. 1A shows a schematic plan view of a substrate electrode structure according to the first embodiment of the present invention.
Figure 1B:
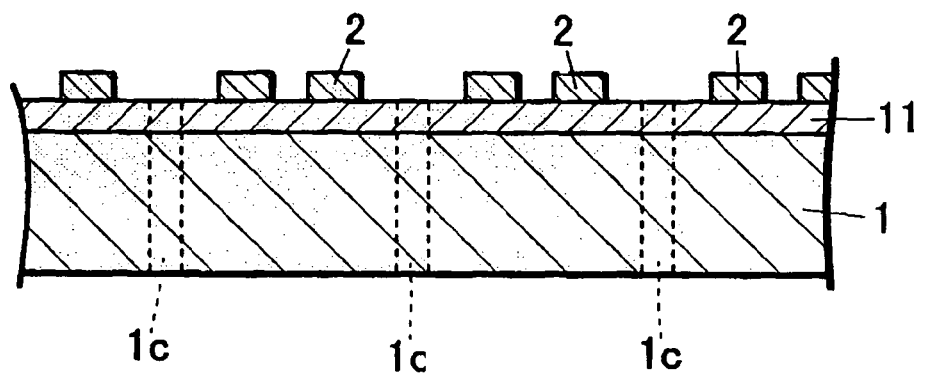
FIG. 1B shows a cross-sectional view taken along line I-I' in FIG. 1A.

Concretely, as shown in FIGS. 1A and 1B, in the substrate electrode structure according to Embodiment 1, an electrode forming surface layer 11 is formed on one main surface of the nitride semiconductor substrate 1 and an electrode 2 is disposed thereon, with the first n-type impurity distributed in a higher concentration in the vicinity of the surface of one main surface than that of deeper regions in the electrode forming surface layer 11.

Here, the portions shown as 1C in FIGS. 1A and 1B are typical in a nitride semiconductor substrate due to its manufacturing method, and have a relatively high occurrence of defects and have a surface with an inversed polarity. Accordingly, in general, those portions are avoided when disposing an electrode.

Now, a manufacturing method of a substrate electrode structure according to Embodiment 1 of the present invention will be described below.

The substrate electrode structure according to Embodiment 1 of the present invention is fabricated by a manufacturing method comprising a step for polishing to polish one main surface of the nitride semiconductor substrate 1 (FIG. 2B), and a step for etching the polished surface of the substrate (FIG. 2C) by way of dry-etching. Here, at least one element in Group IV and Group VI, such as silicon (Si), oxygen (O), and selenium (Se) is used as an active species for dry-etching or as an atmosphere gas in the etching process.

Especially, in the present manufacturing method, etching is carried out using above-described active species and atmosphere gas, as a step to facilitate the fabrication of the electrode, after the polishing process. With this method, an electrode having excellent properties can be formed on the substrate.

Each step will be described in detail below.

(Preparation of the Nitride Semiconductor Substrate 1)

Figure 2A:
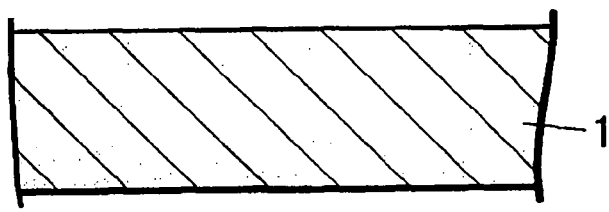
FIGS. 2A to 2D are cross-sectional views showing the steps of a method of manufacturing a substrate electrode according to the first embodiment of the present invention.

As shown in FIG. 2A, in the present manufacturing method, firstly, a nitride semiconductor substrate 1 is prepared.

GaN, AlN and the like are used as a nitride semiconductor substrate 1 in the present invention, especially GaN is suitably used. Various manufacturing methods of GaN substrates have been known. Among them, a method includes a process of growing a nitride semiconductor layer on a foreign substrate which is made of a different material than that of the nitride semiconductor by using a vapor growth method such as an ELO (Epitaxial Lateral Overgrowth) method, a selective growth method, and the like, so as to decrease the crystal defects (threading dislocation) entirely and selectively. The method also includes a step of removing the foreign substrate used as a growth substrate after growing the nitride semiconductor layer, so as to obtain a single nitride semiconductor substrate. The nitride semiconductor substrate fabricated as described above is used preferably in the present invention.

Other than the nitride substrate separated from the substrate as described above, a nitride semiconductor substrate (bulk single crystal) formed by a crystal growth method such as the CZ method, the Verneuil's method, the Kyropulos method, a hydrothermal method, and a flux method can be used.

As described above, the nitride semiconductor substrate 1 is fabricated by using ELO method, selective growth method, etc. However, in such a nitride semiconductor substrate 1 fabricated by the method described above, crystal defects and threading dislocation may occur periodically within a plane (for example, the portions 1c which are schematically shown in FIGS. 1A and 1B are high in crystal defects and threading dislocation densities), and N-polarity and Ga-polarity of the nitride semiconductor crystal may have in-plane distribution according to the growth method (for example, in FIG. 1A, the surface of the portions 1c has an inversed polarity compared with other portions). In the present invention, it is preferable to form the substrate surface whereon the electrode to be disposed (one main surface) or at least the electrode forming region of the substrate surface into a low defect density region or a low dislocation density region. However, an excellent device can also be fabricated by arranging the device structure or at least operating portion of the device structure in the low dislocation density region described above. Therefore, a substrate electrode can be disposed over the regions having different dislocation densities.

In a concrete example of obtaining a single substrate by ELO method and a selective growth method using a foreign substrate, a layer of nitride semiconductor is fabricated by lateral growth by selectively growing from a portion of the substrate surface, for example, openings of a mask or island-shaped nitride semiconductor regions. In such a case, a region having a high threading dislocation density and a high crystal defect density, wherein the threading dislocation concentrates, occurs at a meeting portion of the selective growth and the lateral growth, and other regions having a lower density thereof can be preferably used for forming the device structure.

The protruding nitride semiconductors of a domain region are grown in a lateral direction to fill the side surfaces of the crystal plane (facet plane) thereof so as to bend and converge on the threading dislocation. Thus, a nitride semiconductor layer where the threading dislocation and crystal defect are reduced can be obtained. The nitride semiconductor layer thus grown can also be used as a substrate.

The nitride semiconductor substrates obtained by such a growth mode have the crystal defect density and the threading dislocation density distributed within a plane periodically or non-periodically, as described above. In the present specification, the growth mode means overall methods and conditions etc. involved in fabricating the nitride semiconductor substrates.

The single substrate described above has main surfaces on a splitting surface (separation surface) side and a growth surface side. Here, the main surface of the growth surface side has a Ga-polarity which is suitable to grow the nitride semiconductor. Therefore, it is preferable to arrange the growth surface side (the opposite main surface of the substrate, the first main surface) to the device structure forming surface side, and the opposite surface side to the substrate forming side 11 (one main surface of the substrate, the second main surface).

Consequently, in the present invention, it is preferable to use a Ga-polarity surface (0001) in C-plane which is suitable for growing the nitride semiconductor as a surface for growing a device structure of the substrate, and a N-polarity surface (000-1) in C-plane as one main surface for growing an electrode. Here, in the present specification, a bar in the parenthesis (-) indicating the plane indices represents the bar above the numeral in the next position.

As described above, the N-polarity surface is usually inferior to the Ga-polarity surface in ohmic characteristics when forming an electrode. However, according to the present invention, this problem is overcome and a superior electrode contact is obtained.

Generally, in the nitride semiconductor substrate, in the substrate oriented with its c-axis, when the above described Ga-polarity surface (0001) in C-plane (polarity surface of Group-III elements, cation surface) is arranged as the growth surface side, the opposite surface side (splitting or removing surface) is of an inverse polarity of an N-polarity surface (polarity surface of Group-G elements, cation surface). In the present invention, the opposite surface is one main surface (the second main surface) which is subjected to etching. The polarity depends on the orientation of the surface of the nitride semiconductor substrate, so that the surface does not necessarily have one polarity as in the C-face substrate.

The nitride semiconductor substrate 1 may contain a second n-type impurity in order to obtain an n-type conductivity. Here, it is preferable to use different elements as the first and the second n-type impurities. Moreover, in cases where the concentration of the second n-type impurity in the substrate is distributed within the plane as described above, the present invention can function preferably. For example, even when the second n-type impurity is distributed unevenly in the electrode forming region, a superior electrode can be formed by providing the first n-type impurity region with a relatively uniform concentration distribution which is different than that of the second n-type impurity.

Thus, in the nitride semiconductor substrate including an n-type impurity, if the substrate is obtained according to the growth mode described above, a dopant suitable for the growth mode can be selected as the second n-type impurity. In contrast, an element can be selected as the first n-type impurity which will be incorporated by the etching process according to the present invention, in view of its contacting-property with the electrode and thermal stability. Consequently, it is suitable because different elements can be respectively selected by using an element as the first n-type impurity which is different than the second n-type impurity which is suitable for the growth mode.

Substrate 1 in FIGS. 1A and 1B shows an example of the nitride semiconductor substrate obtained by the growth mode using a selective growth method or the ELO method, etc. described above. For example, in the lateral growth described above using a selective growth method, different regions occur as shown in a schematic view of the substrate surface in FIG. 15A. That is, in growing the single substrate, the selectively growing regions (seed portions) 52 and the merging regions 1c become the regions with a high crystal defect density and a high threading dislocation density, and other regions 51 obtained by lateral growth or facet growth become the regions with a low crystal defect density. In addition, in cases where the second n-type impurity is doped during the growth it depends on the growth mode. Therefore, the second n-type impurity concentration may differ between the above-described regions 51 and 52. For example, a high concentration may be in the region 51 and a low concentration may be in the region 52, resulting in a distribution of the second n-type impurity concentration within the surface of the substrate.

Figure 15A:
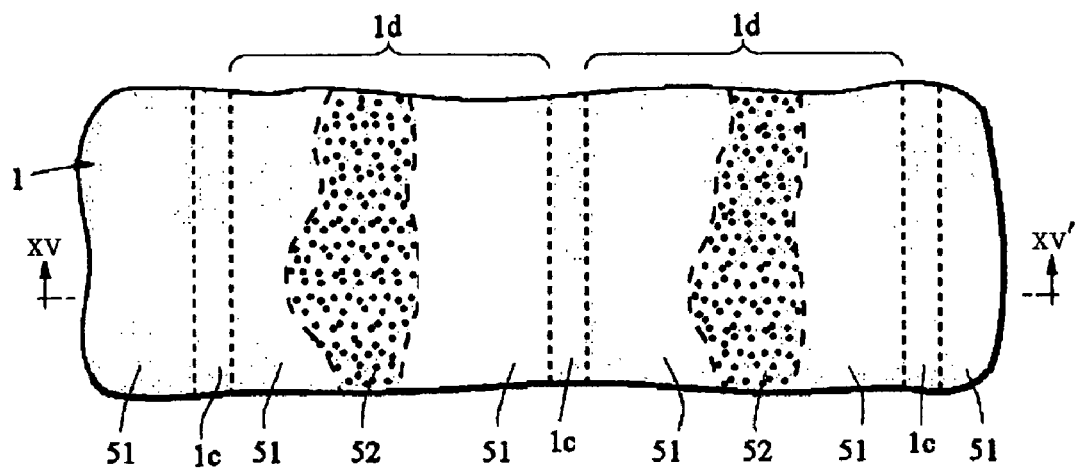
FIG. 15A is a schematic plan view showing an embodiment of the nitride semiconductor substrate used in the present invention.
Figure 15B:
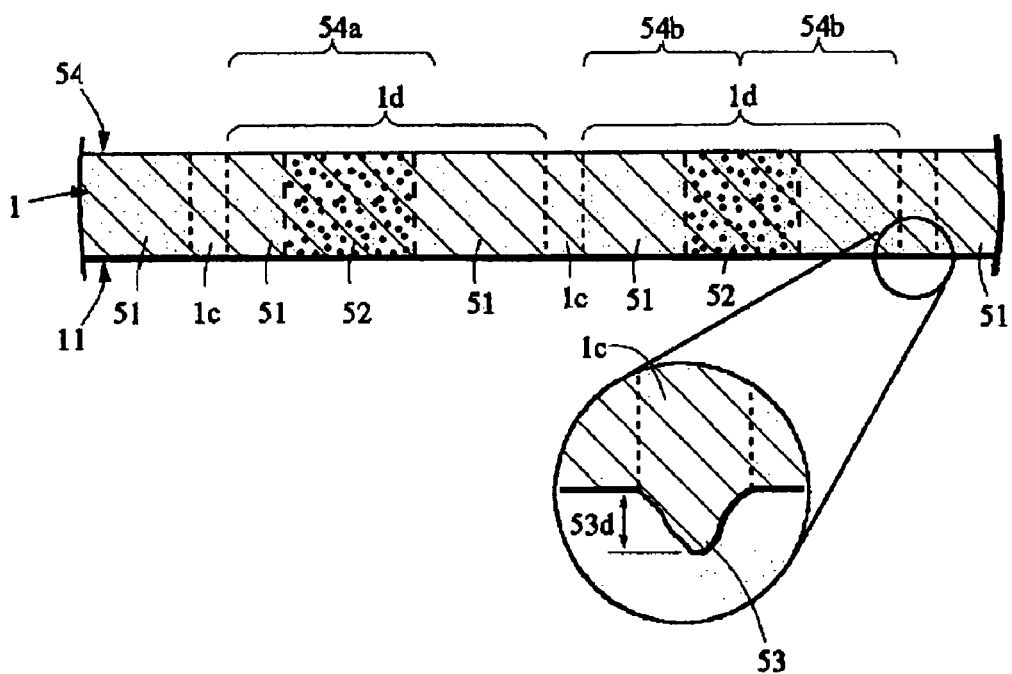
FIG. 15B is a schematic cross-sectional view taken along line XV-XV' in FIG. 15A.

In a different example, in cases where polarity surfaces are distributed within a substrate surface as described above, a region having one type of polarity surface can be prepared widely for the device forming region 54a, provided that the regions 1c and 1d shown in FIG. 15A have inverse polarities. When the device structure is constructed on the opposite main surface (the first main surface) 54 of the substrate, the device forming region 54a is provided in the region 1d in the wide polarity surface side. Here in cases where the second n-type impurity concentration is distributed as shown in FIGS. 15A and 15B, the device forming regions 54a and 54b may be formed over both the high concentration region 52 and the low concentration region 51. For example, the second n-type impurity concentration can be low in the region 52 and high in the region 51. Even in such a case independent of the in-plane distribution 51 and 52 of the second n-type impurity concentration in the substrate 1, the region containing the first n-type impurity can be formed in the vicinity of the surface of the electrode forming region 11 of the substrate. Therefore, the electrode can be desirably formed and the desirable substrate-side electrode of the device can be obtained.

In an n-type nitride semiconductor substrate, other than being doped with an n-type impurity, the n-type conductivity can also be obtained in a substrate with no added impurities or in an undoped substrate, due to the nitrogen vacancy in the nitride semiconductor. Therefore, such a substrate can also be used.

(Polishing Process)

Figure 2B:
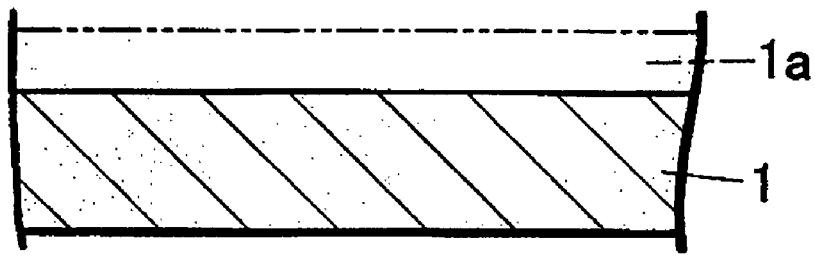

As shown in FIGS. 2A and 2B, in the manufacturing method according to the present embodiment, one main surface of the nitride semiconductor substrate 1 is polished as shown by reference numeral 1a.

Generally, the nitride semiconductor substrate is fabricated with a specific growth mode so that excessive bent and inferior surface morphology occur frequently. Polishing is carried out in order to reduce such defective features, and the amount of polishing is decided according to the surface morphology condition. Polishing is also employed to reduce the thickness of the nitride semiconductor substrate so that chips (dividing of the substrate) can be made with ease. In such a case, the amount of polishing area 1a is decided so as to reduce the thickness to a thickness that is useful for dividing the substrate.

In this polishing process, a mechanical method can be employed to polish the nitride semiconductor substrate using a conventional grindstone or an abrasive such as diamond.

In the polishing process, a chemical-mechanical polishing (CMP) step can also be employed after the mechanical polishing step.

When the chemical-mechanical polishing step is further added after the mechanical polishing step, the surface of the nitride semiconductor substrate can be improved. However, on the other hand, a tendency dependent on the polarity of the crystal on the surface may occur, and the crystal anisotropy due to chemical etching may be affected. In the manufacturing method according to the present invention, however, such a tendency and effect can be prevented by the dry-etching step described below, and an electrode can be formed while reducing those effects.

Specifically, as shown in FIG. 15B, in the electrode forming surface 11 side (polished surface side), when a first polarity surface 1d and a second polarity surface 1c of reversed polarity, for example, the Ga-polarity surface 1c and the N-polarity surface 1d exist on the electrode forming surface 11 of one main surface of the substrate, there is a tendency that each polarity surface obtains properties of different mechanical strength and etching rate, etc. by a mechanical polishing or a chemical polishing such as CMP.

Especially, due to the difference in the etching rate in a chemical etching between the Ga-polarity surface and the N-polarity surface, the Ga-polarity surface (the second polarity surface 1c) is hardly etched, so that within the polished surface of the substrate, the N-polarity surface (region 1d) is more than the Ga-polarity surface (region 1d), and the protrusions 53 as shown in the partially enlarged view in the circle in FIG. 15B are formed.

As described above, when a chemical etching is performed in order to remove the damaged layer such as defective features described above resulting from mechanical polishing, the protrusions 53 may be created and further manufacturing processes may become complicated, such as in handling the devices, dividing of the substrate, and chipping.

For this reason, as in the present invention, the height 53d of such protrusions 53 is reduced after the polishing process by partially removing the damaged layer in the dry-etching step described later. For example, reduction can occur by employing a chemical etching step such as CMP in combination with a polishing step in removing the damaged layer, or by dry-etching the entire damaged layer, for example, by carrying out an etching in a etching process (dry-etching) and not carrying out a chemical etching in the polishing process. Thus, the height 53d of the protrusions 53 can be reduced so that their deteriorative effects on the device manufacturing and deterioration of cleavability can be suppressed.

Thus, when chemical etching is carried out as an aftertreatment of the polished process, the protrusions 53 occur in a portion of the polarity surface 1c within the surface described above. However, in the present invention, the height of the protrusions 53d can be minimized by carrying out a etching process using a physical etching, so that the manufacturing of thin substrates becomes possible.

In cases where the protrusions 53 in the polarity surface 1c, distributed within the substrate surface, occur due to a chemical etching and CMP polishing performed as the after-treatment of the polishing step, it is preferable to adjust the height 53d of the protrusions to 1 μm or less, by controlling the etching amounts in the chemical etching which is the after-treatment of the polishing process and in the etching process.

As described in after-mentioned Example 1, when aiming to make a substrate thin in the polishing process, it is preferable to include a step for making the substrate thin film where the thickness of the substrate is reduced significantly by employing, for example, grinding, and a step for making a flat surface where the rough surface resulting from the polishing step is flattened by using, for example, a diamond abrasive grain. The polishing process which makes a thin substrate suitable for manufacturing the devices can be provided by further including a step for making the substrate surface a mirror surface, for example, by using a diamond abrasive grain, and a step for removing the damaged layer, for example, by way of CMP polishing, after the step of making a flat surface, as described in Example 1 below. As an example of the polishing amount in each step, about 100 to 500 μm in the thinning step, about 10 to 100 μm in a flattening step and a mirror finishing step, and about 10 nm to 1 μm in a damage layer removing step can be removed from the substrate thickness.

In cases where the device structure is formed on the opposite surface from the electrode forming surface 11 (other surface) as described later, the substrate can be divided by applying cuts or scribings in the device forming surface side and then pushing on it to split it. Cuts or scribings can also be applied to the substrate electrode forming surface side. Even in cases where the protrusions 53 have occurred, the substrate can be divided by applying cuts or scribings to the substrate electrode forming surface side, provided that the protrusions are processed to a suitable height 53d as described above.

In the case described above, the polarity surface distribution occurs within a substrate surface. Differences in the resistance to polishing and chemical etching rate may occur due to the differences in the distribution and the density of the crystal defects and thread dislocations with in the substrate surface, and also in the crystallinity, according to the growth mode. As a result, the protrusions 53 may occur. Here, it is also preferable to carry out the chemical etching treatment and the dry-etching treatment in the etching process in the same manner as in the case with the polarity surface distribution described above, in order to reduce the height and amount of the protrusions.

In cases where in-plane distribution of polarity such as polarity inversion occur in the nitride semiconductor substrate as shown in FIGS. 1A and 1B, the etching speed may differ depending on the polarity. Therefore, a chemical etching, for example, an etching using an etchant such as phosphoric acid, and a chemical-mechanical polishing such as CMP must be carried out with caution in such cases.

(Etching Process)

Figure 2C:
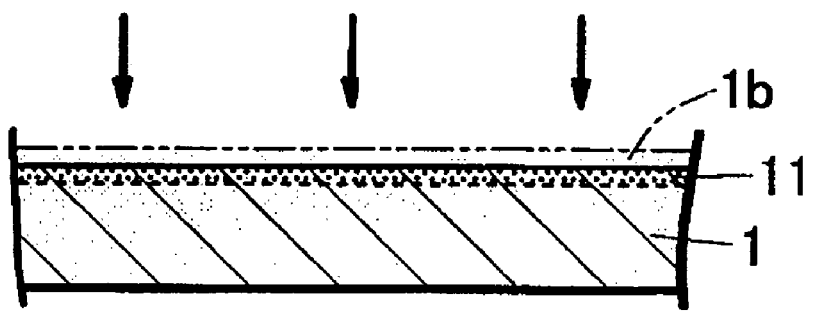

Next, as shown in FIG. 2C, a dry-etching is carried out on the surface of the polished nitride semiconductor substrate 1 by using an active species or an atmosphere gas including at least one of the Group IV elements or the Group VI elements such as silicon (Si), oxygen (O), and selenium (Se).

It is further preferable to include silicon in the active species or the atmosphere gas in the etching process, as shown in the examples described later. With this, the substrate and the device capable of establishing superior ohmic characteristics with the electrodes and having excellent thermal stability can be obtained.

In the etching process of the present invention, other than a gas including chlorine, a gas including a halogen such as fluorine, etc. is used as an atmosphere gas and etching gas, and it is preferable to further include the above described element of Group-IV and Group-VI. According to the results of the examples and the comparative examples described hereinafter, it is further preferable to use an atmosphere and active species including chlorine with above described element of Group-IV and Group-VI. Here, the RIE (Reactive Ion Etching) method is preferable for the etching method as shown in the examples described hereinafter. In addition to this, a method using B, Si, and C which are used suitably with an etching gas and an active species including chlorine, can be employed.

As for the dry-etching method used in the present invention, other than RIE shown in the examples, RIBE (Reactive Ion Beam Etching), ECR (Electron Cyclotron Resonance), ICP (Inductively Coupled Plasma), sputtering, and FIB (Focused Ion Beam), etc. can be used.

In cases where a polishing process using a mechanical method or a chemical-mechanical polishing method such as CMP is carried out, the resulting damaged portion (a portion with a certain amount of thickness) can be removed by the etching described above so that the surface can be recovered. Therefore, in cases where a polishing process is included, an appropriate etching amount 1b is determined in order to remove the damaged portion in view of the steps and conditions of the polishing process.

In Embodiment 1, the damaged portion due to polishing is removed by the dry-etching step, and at the same time, at least one of the Group IV elements and Group VI elements, which is included in the dry-etching step as an active species or an atmosphere gas, is doped in the vicinity of the surface of the nitride semiconductor substrate 1 as a first n-type impurity, and thus, the electrode forming surface-layer 11 is formed (FIG. 2C).

As described above, the substrate having an excellent surface for forming electrodes can be provided even to a polished substrate, according to the manufacturing method of the Embodiment 1 of the present invention.

(Immersion Treatment)

In the present invention, it is preferable to carry out an immersion treatment on the etched surface of the nitride semiconductor substrate 1 using an acidic or alkaline aqueous solution prior to forming the electrodes. In this immersion treatment, it is preferable to use one of hydrofluoric acid, phosphoric acid, sulfuric acid, and hydrochloric acid as an acidic aqueous solution, and potassium hydroxide as an alkaline aqueous solution, more preferably, phosphoric acid or sulfuric acid is used as an acidic aqueous solution. With such an immersion treatment, the adhesiveness of the electrode to the surface of the nitride semiconductor substrate 1 can be improved so that detachment of the electrode can be prevented effectively. Thus, adhesion strength of die bonding can be enhanced effectively. It is considered that the improvement in adhesiveness is due to elimination of unnecessary residual elements from the surface.

(Electrode Forming Process)

Next, an n-side electrode 2 comprising, for example, a first layer 21, a second layer 22 and a third layer 23 disposed on the electrode forming surface layer 11.

The first layer 21 in contact with the electrode forming surface layer 11 preferably includes at least one metal selected from the group consisting of vanadium (V), tungsten (W), molybdenum (Mo), chromium (Cr), zirconium (Zr), niobium (Nb), hafnium (Hf), tantalum (Ta), and titanium (Ti).

That is, the first layer 21 which is in contact with the substrate is formed as a non-alloy (elemental) electrode so that a material having a high melting point described above is suitable as the material for the electrode. W and Mo are especially preferable.

Even if the platinum group used for the second layer is used as the first layer, an electrode having an excellent ohmic characteristic can also be formed.

In Embodiment 1, the layer including a high-melting point material and in contact with the nitride semiconductor substrate 1 is disposed as the first layer and the second layer is disposed thereon. Here, it is preferable to form the second layer 22 with a thickness larger than that of the first layer, and including a metal which is different than that in the first layer 21 and at least one element selected from the group consisting of aluminum (Al), tungsten (W), molybdenum (Mo), platinum group metal [platinum (Pt), palladium (Pd), rhodium (Rh), ruthenium (Ru), osmium (Os), and iridium (Ir)]. With this arrangement, maintaining an excellent electrode thermal stability characteristic becomes possible.

Further, the third layer 23 is formed using, for example, aluminum (Al) or gold (Au).

Other than the electrodes shown in Example 1, concrete examples of the electrode include W (the first layer)/Pt (the second layer)/Au (the third layer), Rh (the first layer)/Pt (the second layer)/Au (the third layer) and the like. The non-alloy electrode described above is not subjected to a heat treatment, although, it is also possible to use an alloy electrode which is subjected to a heat treatment in the nitride semiconductor device. In this regard, it is possible to use electrodes of Ti or Al as the first layer, the second layer and the like, such as Ti (the first layer)/Al (the third layer), Ti (the first layer)/Au (the third layer), Ti (the first layer)/Pt (the second layer)/Au (the third layer). Here, the temperature of a heat treatment of an alloy electrode is, for example, from 300° C. to 600° C. If the heat treatment is carried out at a low temperature, the contact resistance and the ohmic characteristic of the electrode may change and result in a poor thermal stability, due to the heat treatment in the subsequent process, for example, in the heat treatment in the process of die-bonding to the substrate, or from the heat generated by operating the device. On the other hand, the problem in thermal stability may be solved by conducting the heat treatment in a high temperature, for example, at from 500° C. to 700° C. Thus, a metal layer, an alloy, and a stacked structure including the above-described elements, and other compositions can be used for the substrate electrodes of the present invention.

In cases where the device structure described later is included, for example, as in Embodiments 3 and 4, the materials described below can be used. When the electrode of the device structure side (such as the p-electrode) is provided, a single layer or a stacked layer of Ni, Co, platinum group metals which are among the transparent electrode materials below can be used as an alloy electrode as the device structure-side electrode, for example, Ni/Au, Pt/Au, Pt/Rh, Rh/Ir, and Pd/Rh. Concrete examples of the transparent electrode of the p-type nitride semiconductor layer, which is the device structure side, include a metal, an alloy, a stacked structure, and a compound thereof, such as conductive oxide and nitride, including at least one selected from the group consisting of nickel (Ni), platinum (Pt), palladium (Pd), rhodium (Rh), ruthenium (Ru), osmium (Os), iridium (Ir), titanium (Ti), zirconium (Zr), hafnium (Hf), vanadium (V), niobium (Nb), tantalum (Ta), cobalt (Co), iron (Fe), manganese (Mn), molybdenum (Mo), chromium (Cr), tungsten (W), lanthanum (La), copper (Cu), silver (Ag), and yttrium (Y), a conductive metallic oxide such as indium oxide doped with tin (Indium Tin Oxide; ITO) and having the thickness of from 50 Å to 10 µm, ZnO (zinc oxide), $In_2O_3$ (indium oxide), and $SnO_2$ (tin oxide) can be used suitably because of the advantage of transmittance. Appropriate materials are selected in view of the wavelength of light. The transparent electrodes are described above, however, it is needless to say that a non-transparent electrode for a laser device can be formed by suitably selecting the materials, compositions, and thickness, etc.

In the manufacturing method of the electrode structure according to Embodiment 1, even in using the polished nitride semiconductor substrate, a dry-etching is carried out using a specific active species or an atmosphere gas, so that a substrate electrode structure having excellent thermal stability and superior ohmic characteristics can be provided. Further, by forming the electrode 2 using specific electrode materials, a non-alloy electrode, which has been difficult to form, can be realized.

Embodiment 2

The substrate electrode structure according to Embodiment 2 includes a nitride semiconductor substrate having an electrode formed on at least one main surface, and the concentration of a first n-type impurity on the one main surface of the nitride semiconductor substrate 1 is set so that the concentration is higher in the vicinity of the surface of a first region 12 whereon the electrode 20 is formed than that of in the vicinity of the surface of a second region 13 where the electrode 20 is not formed.

The first n-type impurity is, for example, Si.

That is, in Embodiment 2, a sufficient concentration of the first n-type impurity is doped in the vicinity of the surface of the first region 12 where the electrode is formed, so that an excellent ohmic contact is established. Further, thermal stability is obtained and the concentration of the first n-type impurity is controlled in the second region 13, so that deterioration in the crystallinity caused by the impurity addition is prevented.

Figure 3A:
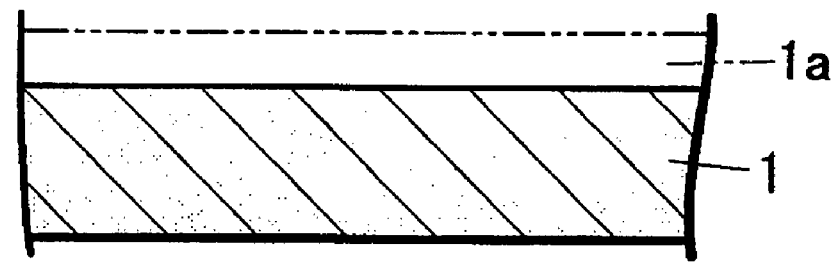
FIGS. 3A to 3D are cross-sectional views showing the steps of a method of manufacturing a substrate electrode according to a second embodiment of the present invention.
Figure 3B:
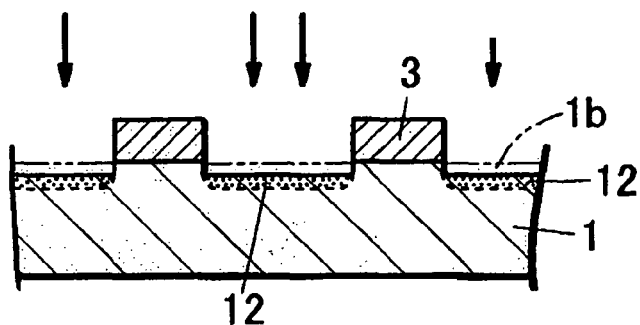
Figure 3C:
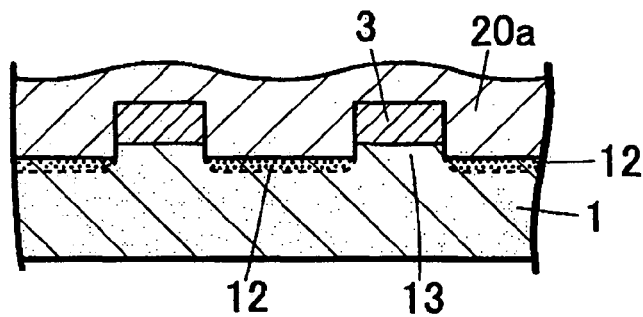

Thus, a relatively high concentration of the first n-type impurity is included partially in the vicinity of the surface of the substrate where the electrode is formed, and a low concentration or none of the first n-type impurity is included in the exposed region where the electrode is not formed (for example, as shown in FIG. 3C). With this construction, the concentration of the n-type impurity is low in the region where the electrode is not formed, so that the crystallinity can be improved.

Also, as shown in FIGS. 3A to 3D, the adhesiveness, the thermal stability, etc. of the electrode can be improved by doping a high concentration of the first n-type impurity in the portion where the electrode is formed, and by forming the recesses by way of etching. Also, by providing a substrate exposed portion among the recesses where the electrode is not formed, contact and cutting or scribing of a fixture for cleavage, for example, a scribing blade such as a cutting blade of a dicer and a scriber becomes easy. Thus, the chip can be cut with ease.

Here, in cases where an etched region and a non-etched region which is only subjected to polishing without being etching are formed within one main surface (a second main face) of the substrate, different contact surfaces tend to occur upon contact with the electrode. Concretely, in a polished surface or a polished region in the CMP-processed surface, a surface condition having relatively good adhesiveness with the electrode material, for example, a surface with moderate, minute irregularity tends to occur. On the other hand, the difference in the products tends to occur in the etching region by dry-etching in the above-mentioned etching process. Further, a polishing agent, an abrasive grain, etc. that are used in the polishing process tend to accumulate as residue, without being removed sufficiently by washing. Such residue may function as a mask in the etching process, resulting in relatively larger irregularity in the surface than the irregularity formed by the polishing process. The etched region and the polished region described above show different properties in adhesiveness, for example, in share stress or in a peeling test. Especially, the polished region tends to have relatively greater adhesion strength than that of the etching region. Such differences tend to occur more significantly by a chemical mechanical polishing such as CMP. Thus, the differences that occur in the etching process may result in defects of electrode exfoliation. However, according to the present embodiment, the substrate electrode is disposed over the polished region and the etched region. Thus, the electrode is also formed over the polished region having excellent manufacturing stability and adhesiveness, therefore, the peeling problem can be solved.

The manufacturing method for substrate electrode structure according to Embodiment 2 of the present invention will now be described below.

The method for the substrate electrode structure according to Embodiment 2 includes the processes of polishing wherein one main surface of the nitride semiconductor substrate 1 is polished (FIG. 3A) and etching wherein the polished substrate surface is dry-etched (FIG. 3B) in the similar manner in Embodiment 1. However, different than Embodiment 1 and prior to the dry-etching process, a mask 3 is formed on the portion where the electrode is not formed.

Concretely, in the manufacturing method for the substrate electrode structure according to Embodiment 2, first, as in Embodiment 1, the nitride semiconductor substrate 1 is prepared and its one main surface is polished (FIG. 3A). Grinding, polishing, step chemical-mechanical polishing (CMP) can be used in the polishing step in the same manner as in Embodiment 1.

Next, in the Embodiment 2, a mask 3, for example, made of SiO2, is disposed on a part of the polished main surface where the electrode is not formed.

Then the part of the polished nitride semiconductor substrate 1 where the mask 3 is not formed is dry-etched by using an active species or an atmosphere gas as used in Embodiment 1 (FIG. 3B).

Here, oxides and nitrides of titanium and zirconium such as silicon oxide ($SiO_x$), silicon nitride ($Si_xN_y$), titanium oxide ($TiO_x$), zirconium oxide ($ZrO_x$), AlN, a multilayer, a metal, and an alloy thereof can be used as the material for the mask. Cu, Au, Cr, etc. can be used as the material for the metal and the alloy, and a photoresist film used in photolithography can also be used.

If the predetermined amount of 1b is removed by this etching process, the damaged portion created by the polishing process can be removed and a first region (electrode forming surface layer) 12 is formed between the masks 3 (FIG. 3B). Here, in the first region 12, at least one element of Group IV and Group VI which is included as the active species or the atmosphere gas is doped in the vicinity of the surface of the nitride semiconductor substrate 1.

Next, an electrode layer 20a which establishes ohmic contact with the first region 12 is disposed so as to come in contact with the surface of the first region (electrode forming surface) 12 and to cover the mask 3 (FIG. 3C).

Figure 3D:
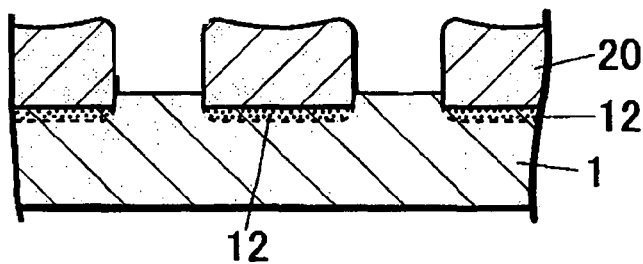

Then, the mask is removed (lift-off) together with the electrode layer thereon (FIG. 3D).

By this, the n-side electrode 20 is provided only on the first region 12.

The substrate surface between the n-side electrodes rises to the extent of the removed portion in the first region, and the protrusions are formed. Then, n-side electrodes 20 are disposed into the recess between the protrusions. With this construction, the adhesiveness of the electrode can be enhanced.

Also, the electrode 20 of Embodiment 2 can be constructed with three layers, for example, the first layer 21, the second layer 22 and the third layer 23 as in the Embodiment 1, so that it can be made as a non-alloyed electrode having excellent thermal stability and ohmic characteristics.

In the substrate electrode structure according to Embodiment 1 and Embodiment 2 described above, the nitride semiconductor substrate 1 has n-type conductivity. Therefore, a device having a pair of positive and negative electrodes placed at the opposite surface sides of the substrate 1 can be fabricated.

In the Embodiments 1 and 2, the second n-type impurity which is different than the first n-type impurity can be included in the nitride semiconductor substrate 1, as described above.

With this arrangement, selection of the first and the second n-type impurities as described below becomes possible. For example, an element which is easy to dope in manufacturing the nitride semiconductor substrate and is excellent in rendering conductivity to the nitride semiconductor substrate is selected as the second n-type impurity. An element which is able to establish a superior ohmic contact with the electrode and renders good thermal stability in the electrode forming surface is selected as the first n-type impurity which is doped in the vicinity of the surface where the electrode is formed. Thus, the different functions of the two n-type impurities can be employed effectively, so that the construction of additional devices with excellent characteristics become possible.

Further, oxygen can be doped as the second n-type impurity in the nitride semiconductor substrate 1. The activation rate of the oxygen dopant can be enhanced by doping the oxygen while forming the nitride semiconductor substrate 1, so that the nitride semiconductor substrate 1 with excellent carrier mobility can be provided.

As described above, in the present invention, the concentration distribution of the second n-type impurity in the nitride semiconductor substrate 1 can be uneven within the above-mentioned substrate surface.

According to Embodiment 2, a region containing the first n-type impurity can be selectively provided even when using a nitride semiconductor substrate fabricated with a specific growth mode where the concentration of the second n-type impurity is distributed within a plane. With this, a stable current supply from the electrode becomes possible without being affected by the in-plane distribution of the second n-type impurity concentration in the nitride semiconductor substrate.

In the present invention, an electrode with far superior ohmic characteristics and higher reliability becomes possible to form in using silicon as the first n-type impurity in the nitride semiconductor substrate 1.

Embodiment 3

A nitride semiconductor device according to Embodiment 3 of the present invention comprises a pair of negative and positive electrodes positioned oppositely with the nitride semiconductor substrate in between. This configuration becomes possible by employing the substrate structure according to Embodiments 1 and 2.

That is, in the nitride semiconductor device according to Embodiment 3, the substrate electrode structure according to Embodiment 1 is employed on one main surface of the nitride semiconductor substrate, and a device structure is fabricated by stacking a plurality of nitride semiconductor layers and a p-side electrode is formed. With this arrangement, a device with excellent thermal stability and ohmic characteristics is obtained.

Further, in the nitride semiconductor device according to Embodiment 3, the substrate electrode can be made as a non-alloy electrode which has been difficult to obtain by a conventional way.

The nitride semiconductor device according to Embodiment 3 can be manufactured as described below.

(Device Structure Forming Process)

Figure 4A:
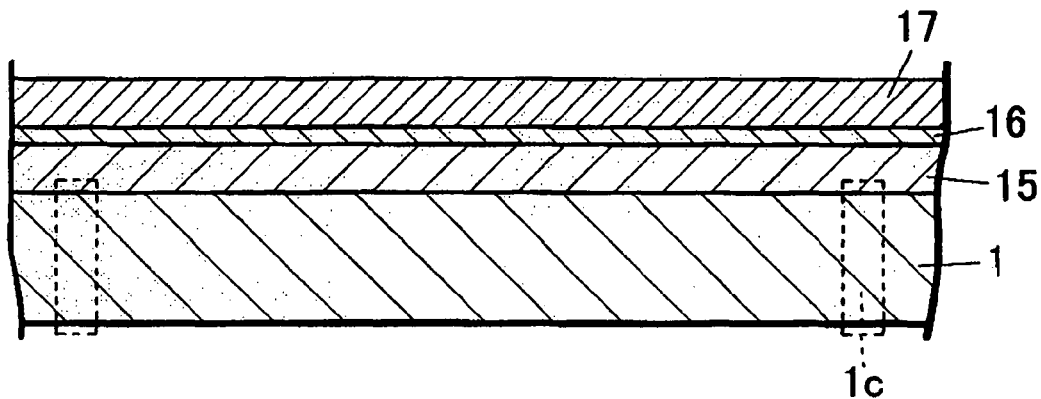
FIGS. 4A to 4C are cross-sectional views showing the steps of a method of manufacturing a nitride semiconductor device according to a third embodiment of the present invention.

For example, an n-type nitride semiconductor layer 15, an active layer 16, and a p-type nitride semiconductor layer 17, which are components of the device structure, are epitaxially grown using MOCVD apparatus on an opposite main surface [(0001) C-plane] of the nitride semiconductor substrate 1 having the n-type conductivity doped with oxygen as a second n-type impurity (FIG. 4A).

(Device Processing and Electrode Forming Process)

Figure 4B:
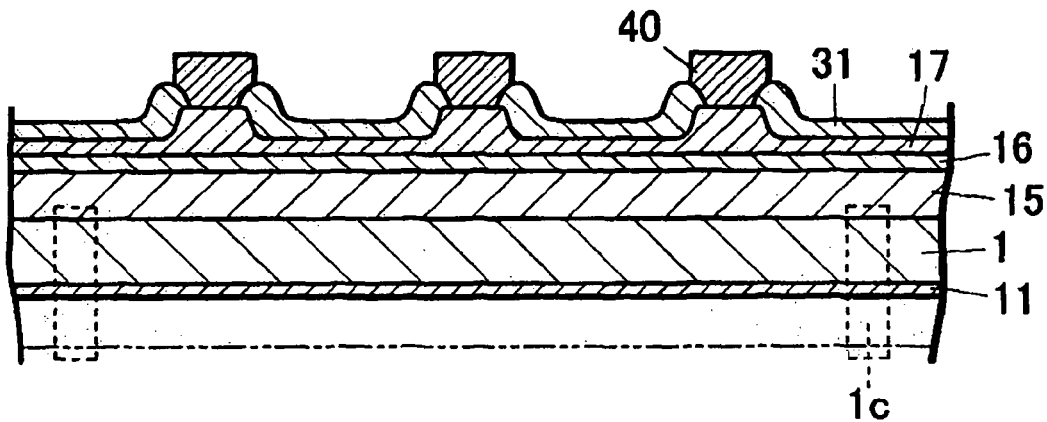

Subsequently, in the device structure comprising the n-type nitride semiconductor layer 15, the active layer 16, and the p-type nitride semiconductor layer 17, a ridge portion is formed in the p-type nitride semiconductor layer 17 by using reactive ion etching (RIE) (FIG. 4B).

Next, an insulating film 31 is disposed from the side surface to the bottom of the ridge, and a p-type electrode 40 is formed on the p-type nitride semiconductor layer 17 which is the top surface of the ridge portion (FIG. 4B). Here, the p-side electrode comprises the p-type ohmic electrode and the p-side bonding electrode thereon.

(Substrate Processing Process)

Figure 4C:
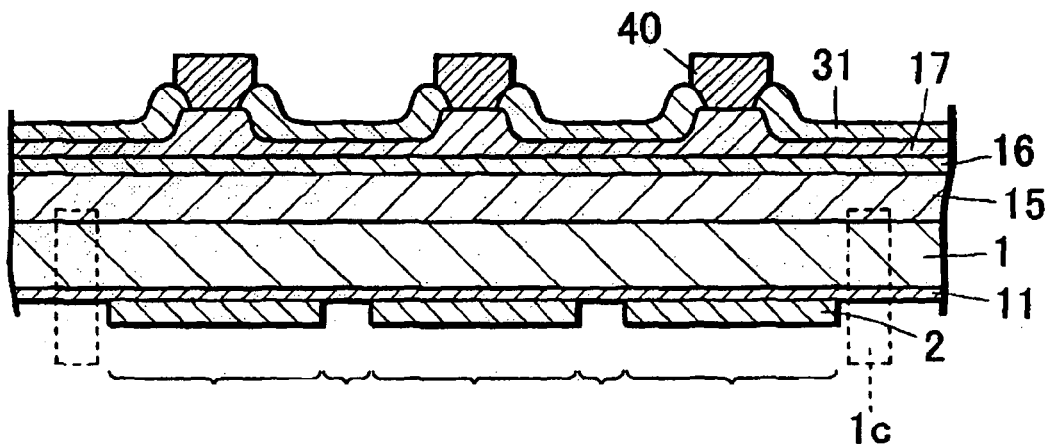

As in one main surface of the nitride semiconductor substrate where the device structure is formed as shown in FIG. 4B, the substrate polishing process, the etching process, and the electrode forming process, each described in Example 1, are performed on the opposite main surface of the nitride semiconductor substrate (FIG. 4C). Then, the wafer is divided and the laser device wherein the device structure which will function as a laser device and the p-side electrode are formed on the opposite surface of the nitride semiconductor substrate and the n-side electrode of the substrate electrode is disposed on one main surface of the nitride semiconductor substrate, is obtained.

In the laser device obtained as described above, the n-side electrode formed on one main surface of the nitride semiconductor substrate 1 is a non-alloy electrode capable of establishing ohmic contact without going through a heat treatment, and also exhibits excellent ohmic characteristics. Thus, the laser devices with excellent properties can be obtained.

Figure 13:
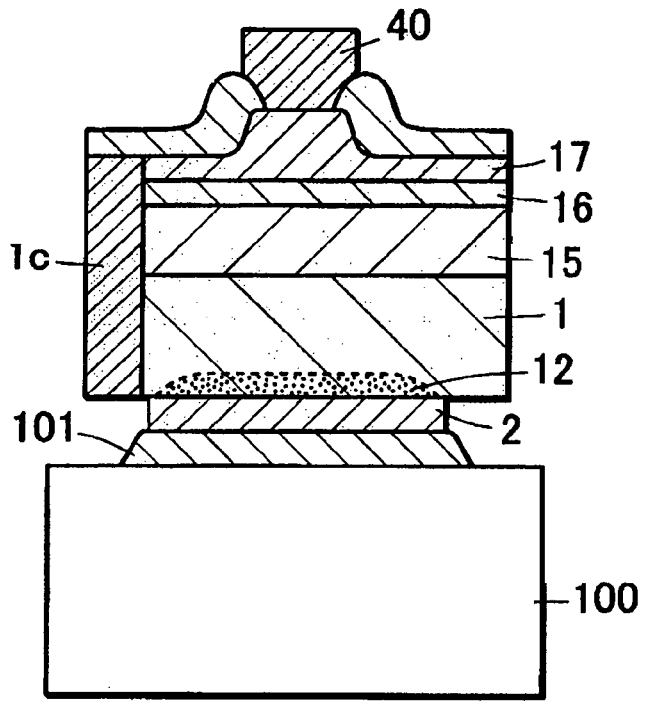
FIG. 13 is a schematic cross-sectional view showing a device according to an embodiment of the present invention.

Moreover, as shown in FIG. 13, excellent ohmic characteristic can be maintained despite the heat treatment in mounting the laser device (for example, shown in FIG. 5A) to a heat sink or a submount 100 such as AlN via a bonding material 101 such as Au/Sn, and further, superior thermal stability can be obtained. Thus, a laser device with high reliability, which is able to remain nearly unaffected by the operating heat generated by operating the laser device, can be obtained.

BN, SiC, GaAs, Si, and C (diamond) are used preferably as the material for the submount other than AlN. It is possible to use other materials such as, a semiconductor substrate made of a semiconductor such as GaAs, GaP, InP, ZnSe, ZnS, ZnO, a single metal substrate, or a metal substrate made of a metal complex including at least two metals which do not form a solid solution or have small solid solution limits. Concretely, the metal material may comprise at least one metal selected from the metals having a high conductivity such as Ag, Cu, Au, and Pt, and at least one metal selected from the metals having high hardness such as W, Mo, Cr, and Ni. Further, it is preferable to use a complex of Cu—W or Cu—Mo as the metal substrate. In cases where the nitride semiconductor substrate according to the present invention is arranged as the bonding surface side, the materials having a suitable difference in the thermal expansion coefficient between that of the substrate are selected, and they are chosen in view of the difference in the thermal expansion coefficient between that of the mounting member used for bonding the submount. This is similar in cases where the opposite main surface of the substrate (the second main surface) is used as the bonding surface side. Here, in cases where a device structure is included, the materials for the device structure are also considered. Cu is preferably used as the mounting member.

As described above, in cases where the nitride semiconductor device is formed by using the substrate electrode structure according to Embodiment 1 or 2, it is preferable to conduct the processes of forming the device structure by stacking the nitride semiconductor layers on the opposite main surface of the nitride semiconductor substrate and forming the p-side electrode on the device structure, prior to the processes of polishing and dry-etching.

Thus, by polishing the substrate in order to reduce its thickness after stacking the nitride semiconductor layers and disposing the electrode thereon, handling of the nitride semiconductor substrate can be facilitated throughout to the polishing process. In other words, the device structure and the electrode are formed before reducing the thickness of the substrate and thus destruction of the substrate can be prevented.

As shown in Embodiments 3 and 4 according to the present invention, in cases where the device structure is formed on the substrate surface, for example, on the opposite main surface, in addition to the substrate electrode, the processes of forming the device structure, processing the device, and forming the electrode are performed. However, other than performing each step of the substrate electrode forming process, the polishing process, the etching process and the electrode forming process of the present invention after the device processing process described above, a part or all steps of the substrate electrode forming process can be performed either prior to forming the device on the substrate surface or between each step of the device forming process described above.

Also, it is preferable to select a superior substrate surface for forming the device structure, for example, Ga-polarity surface in the C-plane of the nitride semiconductor crystal, as the opposite main surface. Here, even when the opposite main surface is the N-polarity surface, the surface can be made suitable for forming the electrode by dry-etching the N-polarity surface (the opposite main surface). Therefore, the conventional problem occurring in forming the electrode can be solved and the device with excellent properties can be obtained.

That is, even in using the N-polarity surface as the opposite main surface where the electrode is formed, the ohmic characteristics can be improved and a device with excellent properties can be fabricated, by incorporating the first n-type impurity in the electrode forming portion by the dry-etching process.

In Embodiment 3 of the present invention, the p-side electrode formed on the device structure can be subjected to a heat treatment to establish ohmic contact. For example, the substrate electrode can be fabricated using the nitride semiconductor substrate having the n-type conductivity. Here, after the top layer of the nitride semiconductor substrate is formed as the p-type layer, the p-side ohmic electrode is formed on the p-type layer and a good ohmic contact is established, a mechanical polishing (polishing process) and dry-etching (etching process) are performed on the one main surface of the substrate.

By this method, a device having a good ohmic contact in both p-side and n-side can be fabricated.

Embodiment 4

An example of the device structure employing the substrate structure according to or similar to Embodiments 1 and 2 of the present invention and different than that of Embodiment 3, will now be described.

Here, the layers constructing the device structure can be formed using GaN, AlN, InN, or a mixed crystal thereof, and a known method and material can be used for processing the device structure and/or forming the electrode.

Figure 5A:
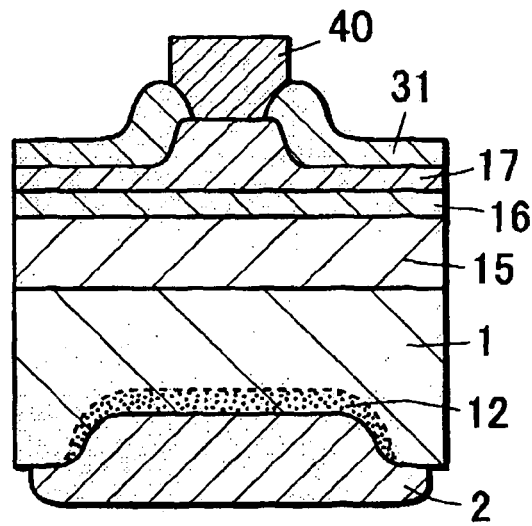
FIGS. 5A to 5D are cross-sectional views showing examples of nitride semiconductor device structure according to a fourth embodiment of the present invention.
Figure 5B:
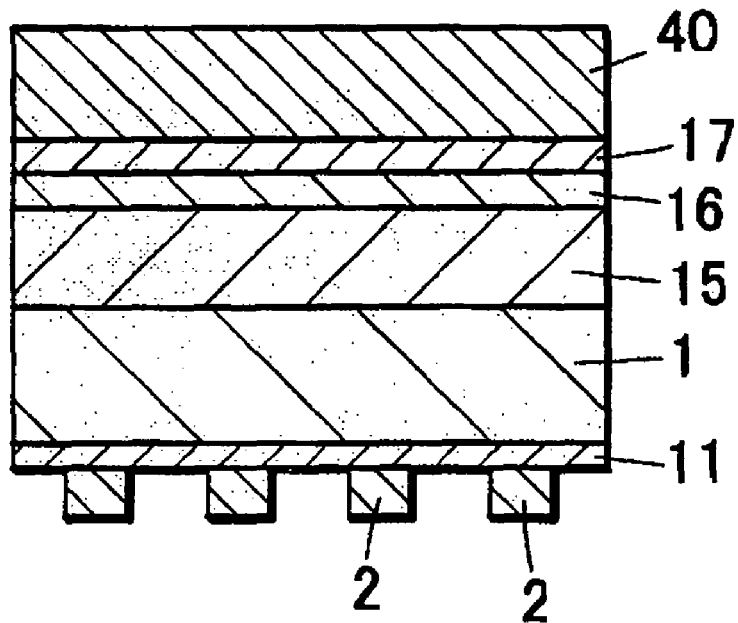
Figure 5C:
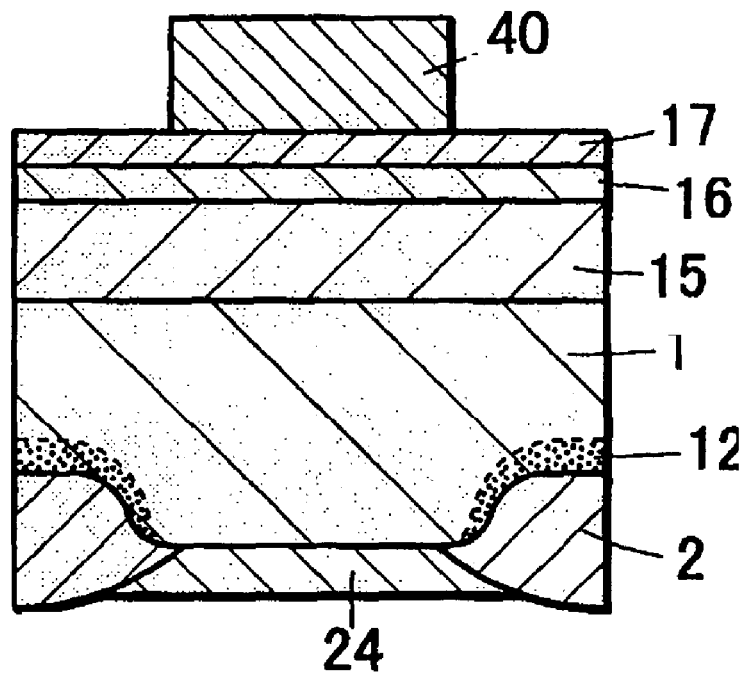

Concrete examples for the device include a light emitting device such as a light emitting diode (LED) and a laser diode (LD) where the p-side and n-side electrodes are placed on each side of the nitride semiconductor substrate as shown in FIGS. 5A to 5C. A device can be formed having the device structure and the substrate electrode (for example, the n-side electrode) on the same surface side with the substrate surface (the second main surface).

Figure 5D:
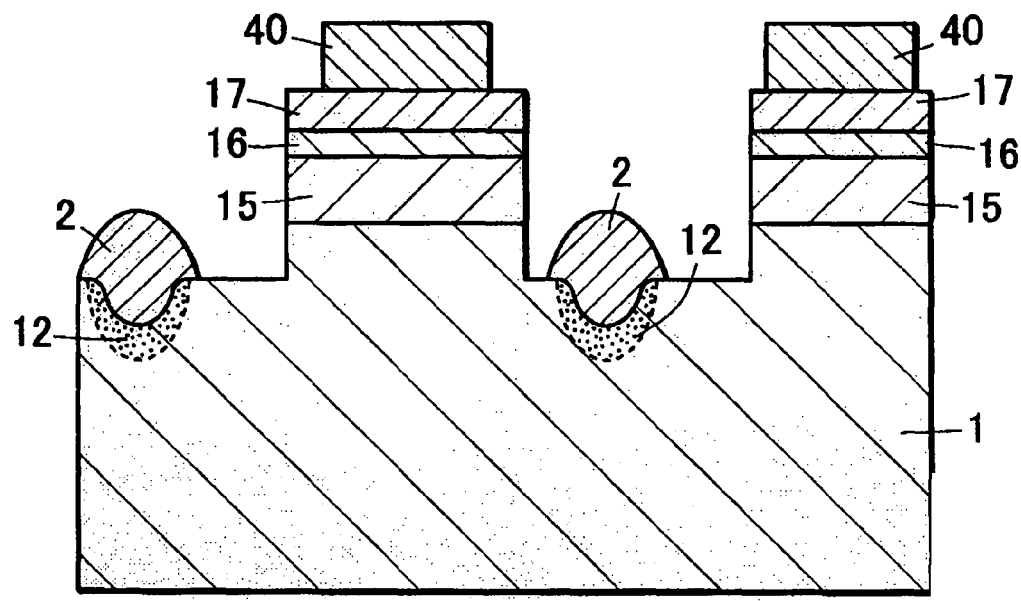

The substrate electrode may comprise a single electrode in the n-side and the p-side respectively in each device as shown in FIG. 5A, or either or both of the n-side and the p-side of the electrodes comprises a plurality of electrodes in each device as shown in FIGS. 5B to 5D. Also, the number of the electrodes forming the p-side electrode and the n-side electrode may either be the same or different.

An example of the device shown in FIG. 5A is, for example, a structure employed for a laser device. The device structure is constructed in such manner that an n-type nitride semiconductor layer 15, an active layer 16, and a p-type nitride semiconductor layer 17, which are respectively made of a nitride semiconductor, are stacked on the opposite main surface of the nitride semiconductor substrate 1, a ridge portion is formed in the p-side nitride semiconductor layer, and the p-side electrode is disposed on the ridge.

Also, a substrate electrode forming portion 12 doped with a first n-type impurity in a higher concentration than that in other portions is formed on one main surface of the nitride semiconductor substrate 1 according to the manufacturing method of Embodiment 2. Then, an n-side electrode 2 is disposed on the substrate electrode forming portion 12.

An example of the device shown in FIG. 5B comprises the structure described below. The device structure is constructed by stacking an n-type nitride semiconductor layer 15, an active layer 16, and a p-type nitride semiconductor layer 17, which are respectively made of a nitride semiconductor, on the opposite main surface of the nitride semiconductor substrate 1. A p-side electrode 40 which is a transparent electrode having optical transparency is disposed on substantially the whole surface of the p-type nitride semiconductor layer 17. A substrate electrode forming portion (substrate electrode forming surface layer) 11 doped with the n-type impurity in a higher concentration in the vicinity of the surface of one main surface of the nitride semiconductor substrate 1 than that in a deeper portion of the substrate is formed continuously on the substantially entire surface of one main surface. An n-side electrode 2 is disposed on the substrate electrode forming portion 11 with a shape such as grids, dots, stripes, rings, and circles, which are separated into a plurality of portions in a cross-sectional view. Such an electrode having a plurality of portions in its cross-section view functions as an electrode with openings thereon, and the openings can be utilized as the light extracting windows. Thus, the light emitting device can be fabricated, where even the electrode with a low or no optical transparency compared with an electrode of the device structure side has a suitable light extracting property. Also, as described in an example below, an electrode having optical transparency can be disposed on the openings of the substrate electrode so as to be electrically connected to the substrate electrode.

An example of the device shown in FIG. 5C comprises the structure as described below. The device structure is constructed by stacking an n-type nitride semiconductor layer 15, an active layer 16, and a p-type nitride semiconductor layer 17, which are respectively made of a nitride semiconductor, on the opposite main surface of the nitride semiconductor substrate 1. A p-side electrode 40 is disposed on the p-type nitride semiconductor layer 17. A substrate electrode-forming portion (first region) 12 doped with the n-type impurity in a higher concentration in the vicinity of the surface in a corner of one main surface of the nitride semiconductor substrate 1 than that in a deeper portion of the substrate is formed according to the manufacturing method of Embodiment 2. The n-side electrodes 2 are disposed on the substrate-forming region 12 respectively. A transparent electrode 24 is disposed on one main surface of the nitride semiconductor substrate except for the substrate forming portion 12 at the corner thereof. Here, the electrode 2 is disposed as the substrate electrode with shapes such as rings or circles as described above. Thus, the electrically connected plurality of electrodes 2 and 21 may be disposed within the substrate surface, and thus, electrodes of different optical transparency, or having a partial optical transparency can be assembled. An electrode having a greater contact resistance with the substrate or an electrode having a Schottky contact can be made by connecting some of the electrodes to the substrate by ohmic contact and electrically connecting other electrodes thereto. Each electrode can be formed as a substrate electrode.

An example of the device shown in FIG. 5D comprises the structure as described below. An n-type nitride semiconductor layer 15, an active layer 16, and a p-type nitride semiconductor layer 17, which are respectively made of a nitride semiconductor, are stacked on one main surface of the nitride semiconductor substrate 1, to form a layered structure. A stripe structure is formed in the layered structure by partially etching the layered structure. Then, a p-side electrode 40 is disposed on the top surface of the p-type layer of the stripe-shaped layered structure.

Both sides of the stripe-shaped layered structure are etched to a degree that the surface of one main surface of the nitride semiconductor substrate 1 is exposed, and the substrate electrode forming portion 12 doped with a first n-type impurity in a higher concentration than that in the other portions is formed according to the manufacturing method of Embodiment 2. Thus, the n-side electrode 2 is formed.

An example of the structure is described in FIG. 5D, where two stripe-shaped layered structures are included, the p-side electrode 40 is formed on the p-type nitride semiconductor layer of each layered structure, and the substrate electrode forming portions 12 are formed on both sides of a layered structure and the n-side electrodes are formed. However, the structure is not limited to that structure in this example.

For example, the structure may comprise a stripe-shaped layered structure having the substrate electrode forming portion formed on either one side or both sides thereof, and the n-side electrode is disposed. The structure may comprise three or more stripe-shaped layered structures, and the substrate electrode forming portion is respectively formed between the layered structures.

As described in Embodiment 4 and Embodiment 3, in the device where the device structure is formed in the substrate, the electrode of the device structure side is not limited to the p-electrode and an electrode suitable for the function of the device can be employed. Also, as understood from the above-mentioned example of the device, a pad-electrode can be used as the electrode of the device structure side. Also, in the present invention, a pad-electrode can be electrically connected to the substrate electrode so as to have a different shape and/or location than that of the substrate electrode.

Example 1

In Example 1 according to the present invention, GaN:O substrate (GaN substrate with the n-type conductivity doped with oxygen as the second n-type impurity) is subjected to RIE processing using ($Cl_2$+$SiCl_4$) after a mechanical polishing, then an n-electrode made of (GaN)/V/Pt/Au is formed.
(Polishing Process)
In Example 1, grinding, polishing, and fine polishing are carried out on a second main surface side of the GaN substrate, as the mechanical polishing process.

Concretely, the second main surface side of the GaN substrate is ground from 425 μm to 135 μm, and then polished from 135 μm to 95 μm which is the same thickness of the substrate, then fine-polishing is carried out to adjust the thickness to 85 μm.

Further, a chemical-mechanical polishing (CMP) is carried out on the finely polished second main surface of the GaN substrate so as to reduce the thickness by about 0.5 μm from the surface.

After those polishing steps, a suitable washing step such as ultrasonic cleaning is carried out as an after-treatment of the polishing process.

The substrate obtained here is used in Comparative Example 1.
(Etching Process)
After the polishing process described above, the nitride semiconductor substrate is placed in a RIE (Reactive Ion Etching) machine and etching is carried out as a pre-process at 300 W for three minutes with using Ar gas.

Subsequently, etching is carried out at 450 W for four minutes using $Cl_2$ and $SiCl_4$ gases.

After the second main surface etching process is finished, it is analyzed by an Auger electron spectroscopy (AES) machine as described later.
(Electrode Forming Process)
After the etching process, the nitride semiconductor substrate is placed in a sputtering machine and an electrode (n-electrode) of a predetermined shape (for example, stripe-shape as in FIG. 1A) is formed on the second main surface (subjected to the etching process) of the nitride semiconductor substrate, by subsequently forming a first layer of V with the thickness of 100 Å, a second layer of Pt with the thickness of 2000 Å, and a third layer of Au the thickness of 3300 Å.

Measurement results of the I-V characteristics of the nitride semiconductor substrate with the n-side electrode formed as described above shows excellent ohmic characteristics without having a heat treatment after the electrode is formed.

Figure 6:
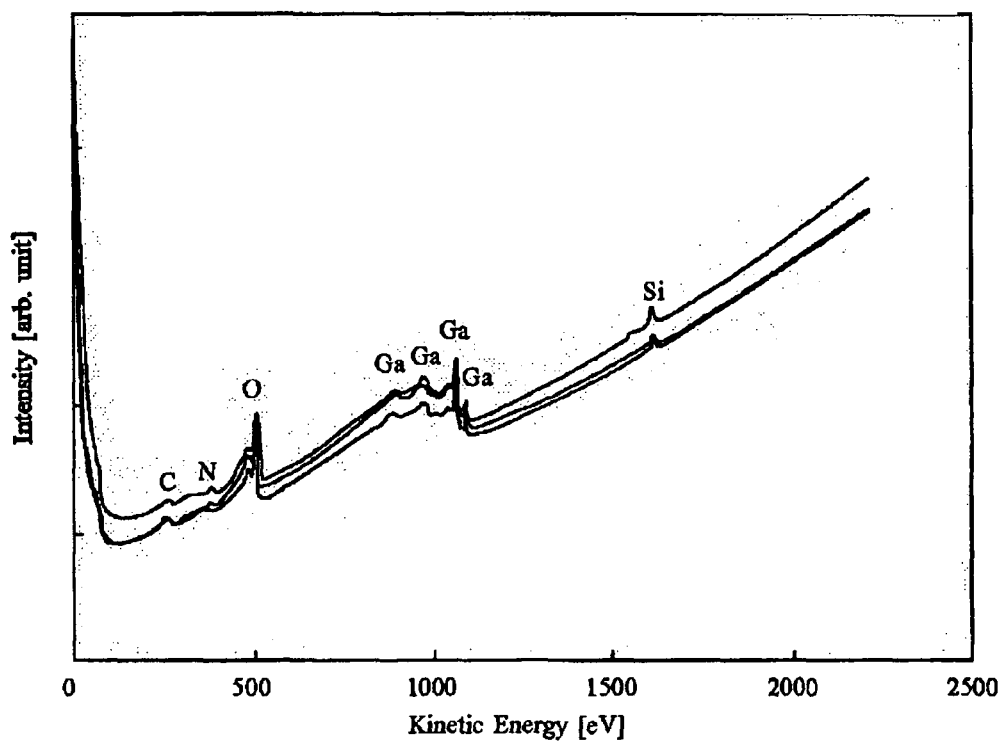
FIG. 6 is a graph showing an Auger Electron Spectroscopy spectra of the substrate according to a first example of the present invention.
Figure 8:
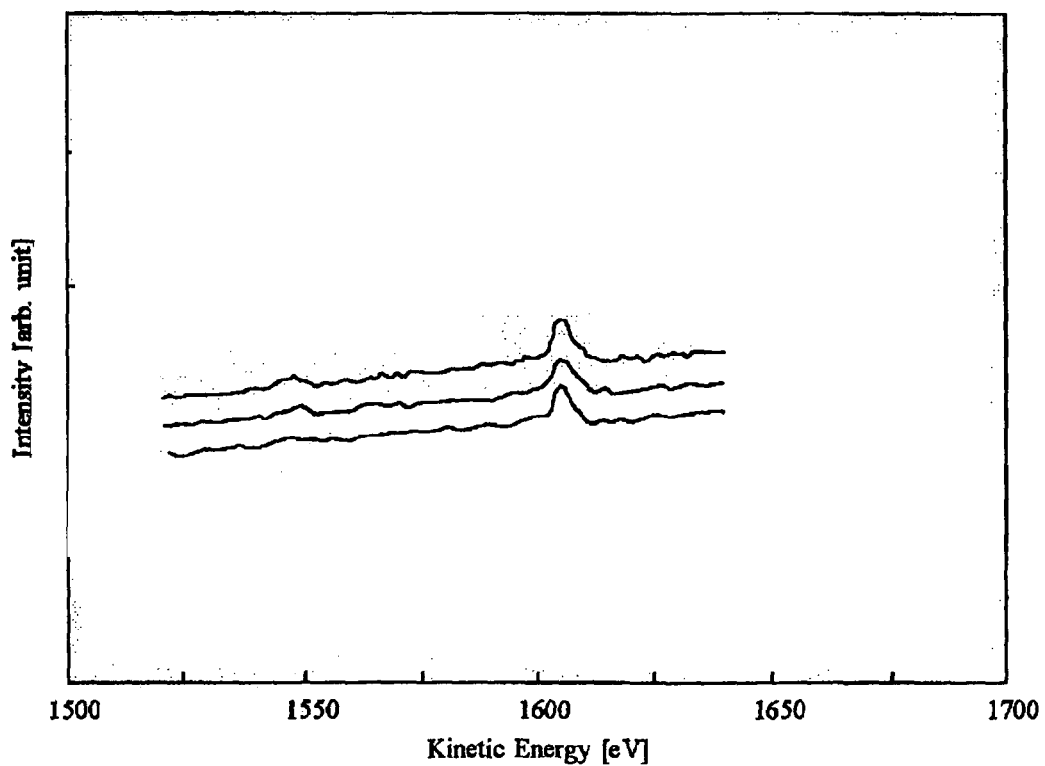
FIG. 8 is a graph showing a spectra of a KLL Auger transition of Si by an Auger Electron Spectroscopy spectra of the substrate according to the first example of the present invention.
Figure 10:
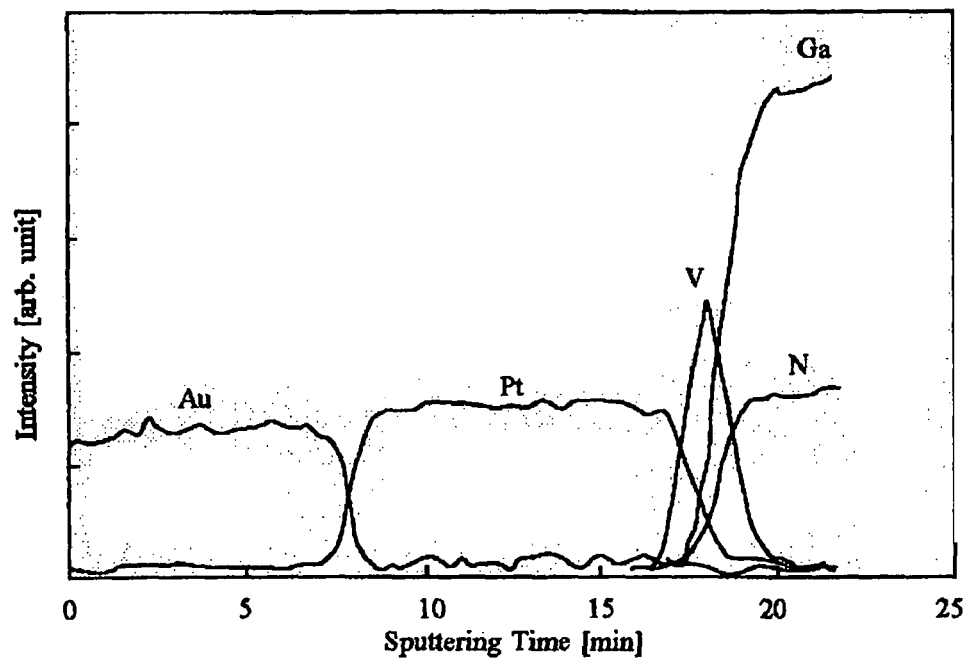
FIG. 10 is a graph showing the depth profile of the substrate by an Auger Electron Spectroscopy according to the first example of the present invention.

Auger electron spectroscopy (AES) analyses on the second main surface of the substrate obtained after the etching process show the results as in FIGS. 6, 8, and 10. Here, an Auger Microprobe JAM-7800F made by JEOL is used in the AES analysis, with the measurement conditions of:

probe energy 10 kV;
probe current $1\times10^{-7}$ A; and
probe diameter 10 μm φ.

Figure 9:
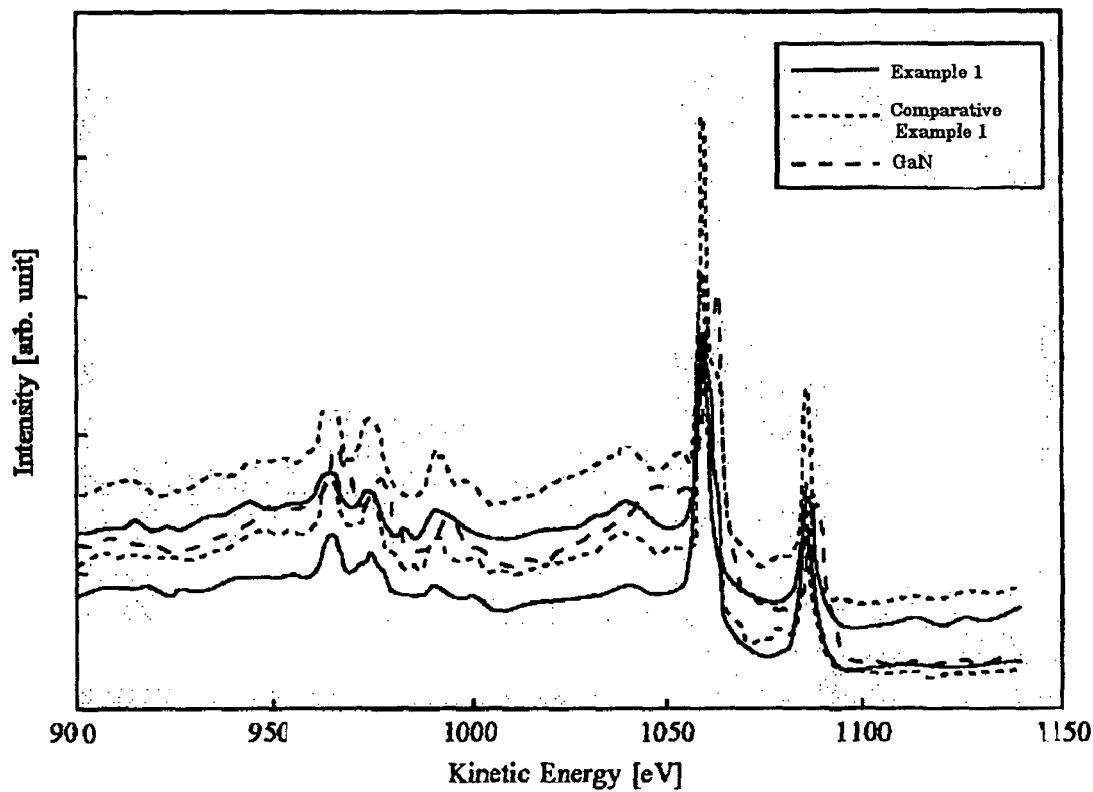
FIG. 9 is a graph showing a spectra of an LMM Auger transition of Ga by an Auger Electron Spectroscopy spectra of the substrate according to the first example of the present invention.

FIG. 6 shows the Auger spectra, FIG. 8 shows the KLL Auger transition spectra of Si and FIG. 9 shows the KLL Auger transition spectra of Ga, and FIG. 10 shows the elemental analysis in the depth direction (depth profile), under the analysis condition where the sputtering rate of the active species Ar is 350 Å·min$^{-1}$.

From the Auger spectrum in FIG. 6, Si is detected with the amount of 14 atm %, and the distribution of Si is assumed to be several dozen angstroms according to the above measuring method and conditions, and the detecting area. Oxygen is also detected and a small amount of carbon is also detected. Further, a portion of Si is assumed to form silicon oxide, SiO$_x$ having a low valence according to the KLL Auger spectrum of Si shown in FIG. 8. A portion of Ga is assumed to be oxidized according to the LMM Auger spectrum of Ga in FIG. 9.

Thus, the nitride semiconductor substrate where Si is detected in the vicinity of the surface (the first n-type impurity containing region portion: 111) can be obtained by the etching process according to Example 1.

The substrate which is obtained after forming the above-described electrode has an elemental distribution in the region from the electrode and around the substrate to the surface of the electrode as shown in the AES depth profile shown in FIG. 10.

A laser device can be formed as described below by using the nitride semiconductor substrate according to Example 1.
(Device Forming Process)

Figure 14:
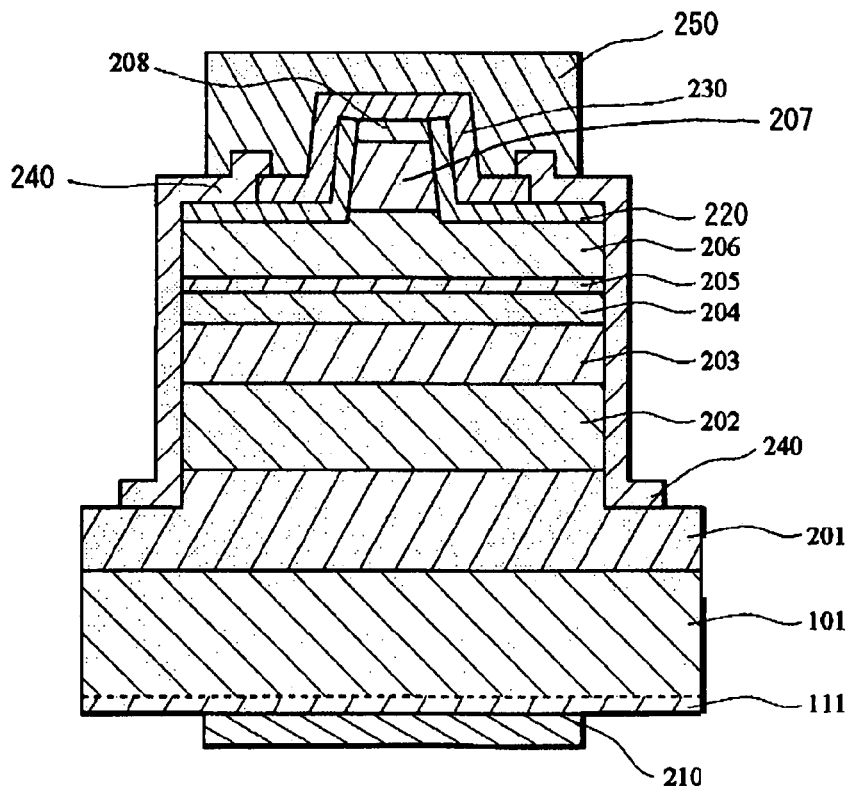
FIG. 14 is a schematic cross-sectional view showing a laser device according to the first example of the present invention.

A device structure as shown in FIG. 14 is grown on the first main surface [(0001) C-plane] of the GaN substrate having the n-type conductivity doped with oxygen.
(Nitride Semiconductor Substrate 101)

The nitride semiconductor substrate (GaN substrate) 101 used here is fabricated, for example, as below.

A buffer layer made of GaN is grown to the thickness of 200 Å, by using a foreign substrate such as sapphire, SiC, Si, and GaAs, at 500° C., using trimethylgallium (TMG) and ammonia (NH3). After the buffer layer is grown, the temperature is adjusted to 1050° C. and an underlayer which is also made of GaN is grown to the thickness of 4 µm. This underlayer serves as the underlayer for growing the nitride semiconductor substrate after a protective film is disposed partially thereon.

After the underlayer is grown, the wafer is taken out from the reactor vessel and a stripe-shaped photomask is formed on the surface of the underlayer. Then, a protective film made of SiO2 is disposed with from 10 to 300 µm in the width of a stripe and from 5 to 300 µm in the interval between the stripes (window portion), by using a CVD machine.

After disposing the protective film, the wafer is transferred to a HVPE (hydride vapor phase epitaxy) machine and the nitride semiconductor made of GaN is grown to the thickness of 400 µm using Ga metal, HCl gas, and ammonia as the raw materials while doping oxygen as the n-type impurity. The crystal defect can be reduced by more than two digits when growing the thick GaN layer with the thickness of 100 µm or more, in growing the nitride semiconductor on the protective film by HVPE method. The foreign substrate is then removed by polishing, CMP, or laser irradiation to obtain GaN (400 µm) as the nitride semiconductor substrate.

An intervening layer such as a buffer layer, a composition gradient, a doping amount gradient, a modulation layer, or a combination layer thereof can be formed between the substrate 101 and the device structure 201 to 208, for the purpose of buffering or improving crystallinity.
(Underlayer 201)

Next, an underlayer 201 having the n-type conductivity made of GaN doped with 10$^{18}$/cm$^3$ of Si at 1050° C. is grown on the nitride semiconductor substrate 101 to the thickness of 1 µm, by using ammonia and TMG, and silane gas as an impurity. Although the n-type underlayer functions as a charge transfer layer in the laser device structure, it can be omitted in a laser device such as in the present example where the positive and negative electrodes 210 and 230 are placed at opposite sides of the substrate. In cases where a pair of positive and negative electrodes is disposed on the same plane (the second main surface) of the substrate, the underlayer can be used as the n-side contact layer whereon the electrode is disposed.
(n-Side Cladding Layer 202)

Then, an undoped Al$_{0.16}$Ga$_{0.84}$N layer is grown to the thickness of 25 Å at 1050° C. by using TMA (trimethylaluminum), TMG, and ammonia. Subsequently TMA is stopped and with a flow of silane gas, the n-type GaN layer doped with 1×10$^{19}$/cm$^3$ of Si is grown to the thickness of 25 Å. A super lattice layer is constructed by alternatively stacking these layers so as to grow the n-side cladding layer made of superlattice to a total thickness of 2 µm. The n-side cladding layer can be a single layer, a combination of a superlattice layer and a single layer, a multilayer with different compositions, dopant concentrations, and refractive indices, or a cladding layer having a combination thereof.
(n-Side Light Guide Layer 203)

Subsequently, the silane gas is stopped and an n-side light guide layer 203 made of undoped GaN is grown to the thickness of 0.17 µm at 1050° C. An n-type impurity may be doped in the n-side light guide layer.
(Active Layer 204)

Next, the temperature is adjusted to 800° C., and a barrier layer made of In$_{0.05}$Ga$_{0.95}$N doped with Si is grown to the thickness of 100 Å, then subsequently, at the same temperature, a well layer made of undoped In$_{0.2}$Ga$_{0.8}$N is grown to a thickness of 40 Å. The barrier layer and the well layer are alternately stacked two times, and at last, an undoped barrier layer is stacked thereon. Thus, an active layer having a multiquantum well structure (MQW) is grown to a total thickness of 380 Å.
(p-Side Carrier Confinement Layer 205)

Next, the temperature is raised to 1050° C. and by using TMG, TMA, ammonia, and Cp$_2$Mg$_5$ (cyclopentadienyl magnesium), a p-side carrier confinement layer 205 doped with 1×10$^{20}$/cm$^3$ of Mg, whose bandgap energy is wider then that of the p-side light guide layer 207, is grown to a thickness of 300 Å. The p-side carrier confinement layer can also be omitted.
(p-Side Light Guide Layer 206)

Subsequently, Cp$_2$Mg and TMA are stopped and a p-side light guide layer 206 made of undoped GaN, whose bandgap energy is smaller than that of the p-side carrier confinement layer 206, is grown to the thickness of 0.14 µm at 1050° C. This light guide layer can also be doped in the same way as the n-side light guide layer.
(p-Side Cladding Layer 207)

Subsequently, a layer made of undoped Al$_{0.16}$Ga$_{0.84}$N is grown to a thickness of 25 Å at 1050° C., and Cp$_2$Mg and TMA are stopped, then a layer made of undoped GaN is grown to a thickness of 25 Å. Thus, a p-side cladding layer 207 comprising a super lattice layer with a total thickness of 0.4 µm is grown.
(p-Side Contact Layer 208)

Finally, at 1050° C., a p-side contact layer 208 made of p-type GaN doped with 1×10$^{20}$/cm$^3$ of Mg is grown to a thickness of 150 Å on the p-side cladding layer. Thus, each layer of the device structure is stacked.

Subsequently, the device structure is processed as described below and an electrode is disposed thereon (FIG. 14).

(Device Processing and Electrode Forming Process: First Main Surface)

A wafer where the nitride semiconductor has been grown as described above is removed from the reactor vessel. A protective film of SiO$_2$ is disposed on the surface of the p-side contact layer which is the top layer, and etching is carried out by way of RIE using SiCl$_4$ gas. Thus, a ridge-shaped stripe is formed. Next, an embedding layer 220 made of ZrO$_2$ is formed so as to protect the ridge-shaped stripe.

Next, after etching into the n-type layer 201 as shown in the figure, a p-electrode 230 made of Ni/Au is disposed on the p-side contact layer 208 and the embedding layer 220. After disposing the p-electrode, a protective film 240 made of Si oxide film (SiO$_2$) is formed to the thickness of 0.5 μm by sputter deposition so as to cover the exposed side surface of the device and a portion of the p-electrode.

Next, Ni/Ti/Au is disposed continuously on the p-electrode exposed from the protective layer 240, so as to form a p-side pad electrode 250.

Here, as shown in FIG. 14, the ridge is formed to the depth so as to leave a portion of the p-side guide layer 206. However, the ridge may be formed with a depth to leave a portion of the p-side cladding layer, according to the design of the waveguide such as changing the embedding materials. Further, after disposing the p-side electrode 230, a heat treatment, for example, at 600° C. for 10 minutes, is carried out on the electrode to establish an ohmic contact. In etching the above-described structure, as shown in FIG. 14, etching is carried out to the underlayer 201 of the n-side cladding layer 202 so as to divide a structure having a portion of the p-side layer, the active layer, and the n-side layer on the first main surface of the substrate to each chip. Etching carried out into the p-side cladding layer is sufficient for dividing it into chips.

(Substrate Processing Process)

Figure 2D:
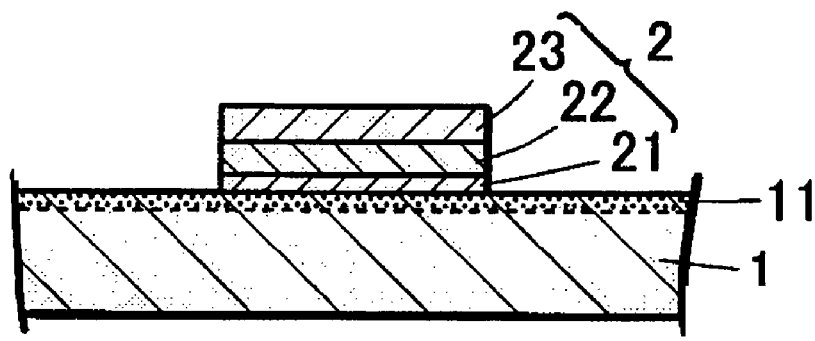

As described above, the device structure is fabricated on the first main surface side of the nitride semiconductor substrate. The above-described substrate polishing process (FIG. 2B), substrate etching process (FIG. 2C), and electrode forming process (FIG. 2D) are carried out to the second main surface of the nitride semiconductor substrate (FIG. 4C). Then, the wafer is cut to obtain the laser device where the device structure which is the laser device and its electrode is formed on the first main surface side of the nitride semiconductor substrate (device processing) and the n-electrode is disposed on the second main surface side of the nitride semiconductor substrate.

As described above, the second main surface side of the wafer of the nitride semiconductor substrate where the n-electrode, the p-electrode, and the p-side pad electrode have been formed thereon is scribed to form scribing grooves. Then the nitride semiconductor substrate is cleaved into bars from its n-electrode forming side, and the M-plane of the cleaved surface (11-00) is made as the resonance surface.

Next, a dielectric multilayer made of SiO$_2$ and TiO$_2$ is formed on the resonance surface, then finally, a bar is divided in parallel with the p-electrode into chips to obtain the nitride semiconductor laser chips. Here, the length of the resonator is from 300 to 1000 μm.

The n-electrode 210 side of the laser chip is bonded to a heat sink via Au/Sn as a bonding material, and the p-electrode 230 is wire-bonded for the operation.

In the laser device chip thus obtained, the n-electrode formed on the second main surface of the nitride semiconductor substrate is a non-alloy electrode which is capable of obtaining ohmic contact without being subjected to a heat treatment and has excellent ohmic characteristics as described above, so that an excellent laser device chip can be obtained.

Further, as understood from Example 2 below, excellent ohmic characteristics can be maintained even after the heat treatment at the time of mounting the laser device chip on a heat sink or a submount such as AlN via a bonding material such as Au/Sn. Further, the laser device chip exhibits excellent thermal stability. Therefore, a laser device chip with a high reliability, with little or no deterioration during heat generated by the operation, can be obtained.

Example 2

(Heat Treatment (at 350° C. for 30 Min.) of the Electrode in Example 1)

Figure 11:
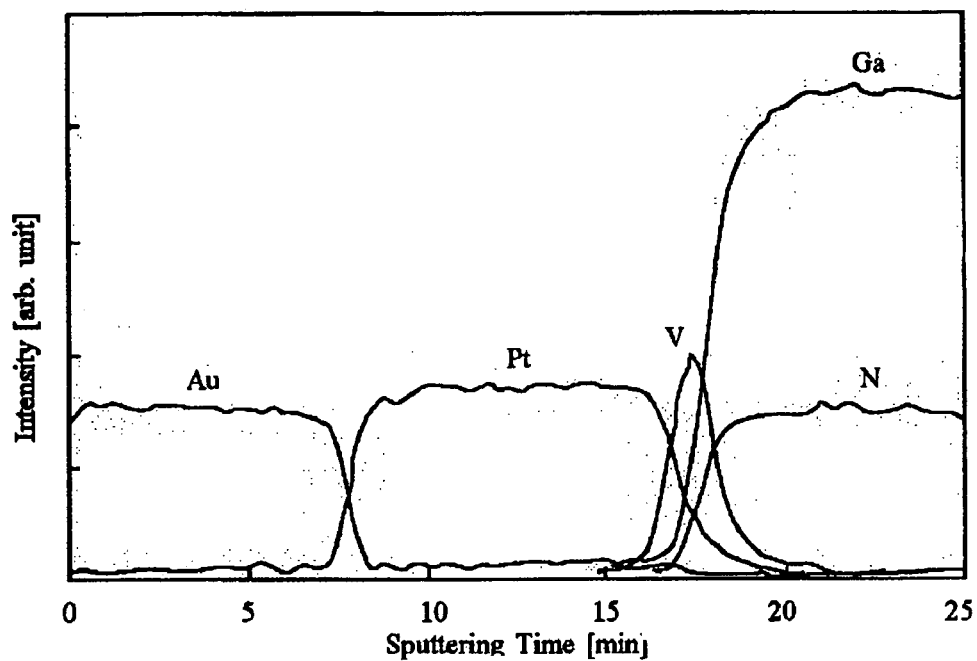
FIG. 11 is a graph showing the depth profile of the substrate by an Auger Electron Spectroscopy according to the second example of the present invention.

In Example 2, a GaN substrate having an electrode is obtained in the same manner as in Example 1, except for carrying out a heat treatment at 350° C. for 30 minutes after forming an electrode on the substrate (the second main surface). The elemental analysis by Auger electron spectroscopy (AES), performed in the same manner as in Example 1 in the depth direction from the electrode formed on the GaN substrate (second main surface), shows the result as shown in FIG. 11. The distribution of elements in each electrode layer is almost the same as that shown in FIG. 10.

The I-V measurement on the n-electrode formed on the substrate (second main surface) shows almost the same properties and ohmic characteristics as in Example 1. From this, it is understood that the electrode with an excellent thermal stability is fabricated on the substrate. As described above, as in Example 1, the properties of the electrode deteriorate only a little or not at all by the heat treatment in the bonding process of the laser device chip to the submount and by the heat released to the submount in the operation. Thus, an excellent device can be obtained.

Example 3

(Using Mask in RIE Processing of Substrate and Removing Mask After Electrode Formation)

In Example 3, the GaN substrate (with electrode formed thereon) and the nitride semiconductor device chip are obtained in the same manner as in Example 1, except that the surface of the substrate (the second main surface) is partially etched by using a mask and the electrode is formed on the etched region in the etching process of the substrate and the electrode forming process, as shown in FIG. 3B.

In detail, the substrate (the second main surface) is polished in the same manner as in Example 1 (FIG. 3A) and a mask made of SiO$_2$ is disposed partially on the polished surface of the substrate, then etching is carried out by way of RIE in the same manner as in Example 1 (FIG. 3B). By this, a portion of the surface of the substrate which is exposed from the mask is removed and a first n-type impurity, Si in the present case, which is the active species of etching is incorporated in the vicinity of the surface of the etched region. Thus, a partial region of the first n-type impurity containing region is formed on the surface of the substrate (the second main surface). In the case where a large amount of substrate is removed by the etching, the electrode forming region with a high concentration of the first n-type impurity is formed as a recessed region.

Subsequently, a film of the electrode is disposed and the mask is removed. By this, the similar electrode as in Example 1 is formed selectively on the recess region which is the electrode forming region including the first n-type impurity on the substrate. The region where the mask was disposed becomes a protrusion region. In the protrusion region, the first n-type impurity is hardly included in the vicinity of the surface of the substrate, because the region was not exposed to the etching gas in the etching process. As the result, the substrate having the first n-type impurity in a higher concentration in the electrode forming region than that of in the electrode exposed portion where the mask is disposed, and the device using the substrate can be fabricated.

Example 4

The manufacturing method in Example 4 according to the present invention is similar to that in Example 1, except that an immersion process using an aqueous solution of sulfuric acid is added after etching the nitride semiconductor substrate by way of reactive ion etching and before forming the electrode.

That is, in Example 4, the nitride semiconductor substrate is immersed in an aqueous solution of sulfuric acid for 10 minutes after being dry-etched in the reactive ion etching machine.

The nitride semiconductor substrate fabricated according to the manufacturing method of Example 4 has a higher adhesion strength in the electrode than that in the substrate of Example 1. Therefore, for example, a laser device with high reliability can be manufactured by using this substrate.

Reference Example 1 (Only $CF_4$ is Used as an Active Spieces in RIE Treatment of Example 1)

The conditions of the etching process are made as below in the electrode formation on the substrate of Example 1, and the electrode is formed on the substrate (the second main surface).

Using the RIE machine, the second main surface of the substrate is etched by Ar gas at 300 W for 3 minutes, and by $CF_4$ gas (active species) at 450 W for 4 minutes.

After the etching process, the n-side electrode is formed on the n-GaN:O substrate, in the same manner as in Example 1.

The results of the measurement of the I-V characteristics (between the adjacent two electrodes) on five portions on the surface (the second main surface) of the substrate (wafer) performed in the same manner as in Example 1 show that any portions have Schottky contact. Further, residue, contamination, and the like is hardly found on the substrate surface after the etching process and the electrode surface after the electrode forming process, so an excellent substrate surface and electrode can be obtained. Because the surface of the substrate is excellent and a change in quality of the electrode tends not to be observed, it is assumed that the ohmic contact can be obtained by selecting suitable materials for the electrode and by the heat treatment.

Comparative Example 1 (without RIE Treatment in Example 1)

In Comparative Example 1, a substrate is formed in the same manner as in Example 1, except for without conducting an etching process. Then, in the same manner as in Example 2, an electrode is disposed on the substrate (the second main surface) and a heat treatment is carried out (at 350° C. for 30 minutes). Thus, a wafer is fabricated.

Figure 7:
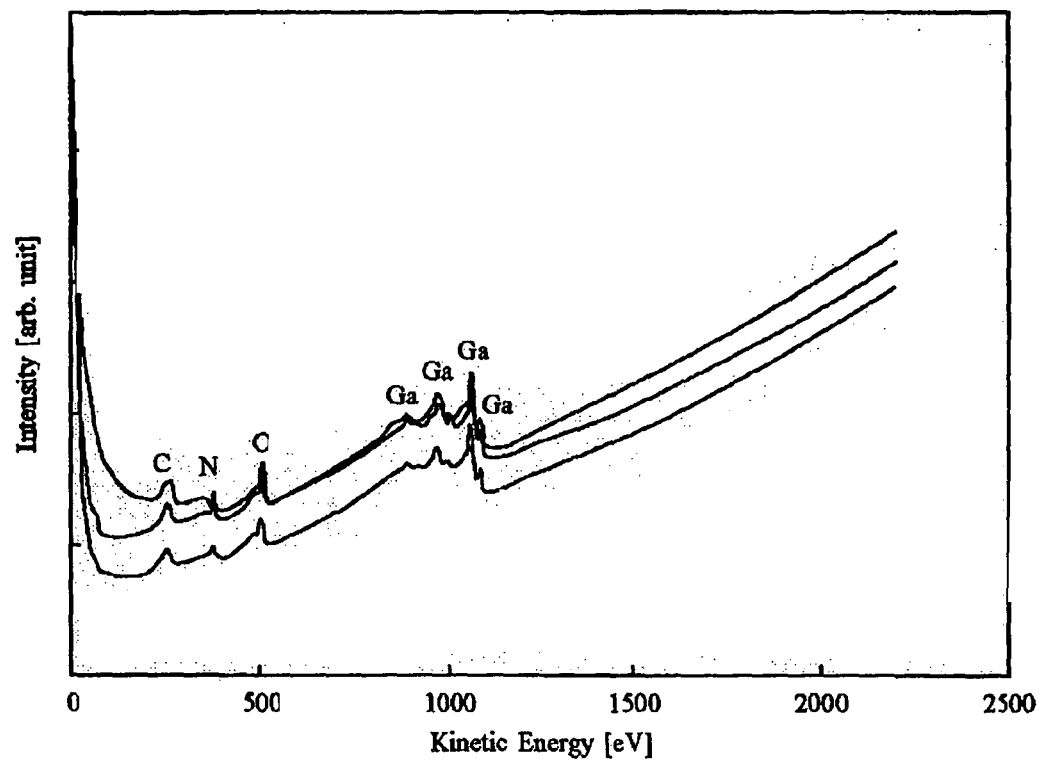
FIG. 7 is a graph showing an Auger Electron Spectroscopy spectra of the substrate according to a first comparative example of the present invention.
Figure 12:
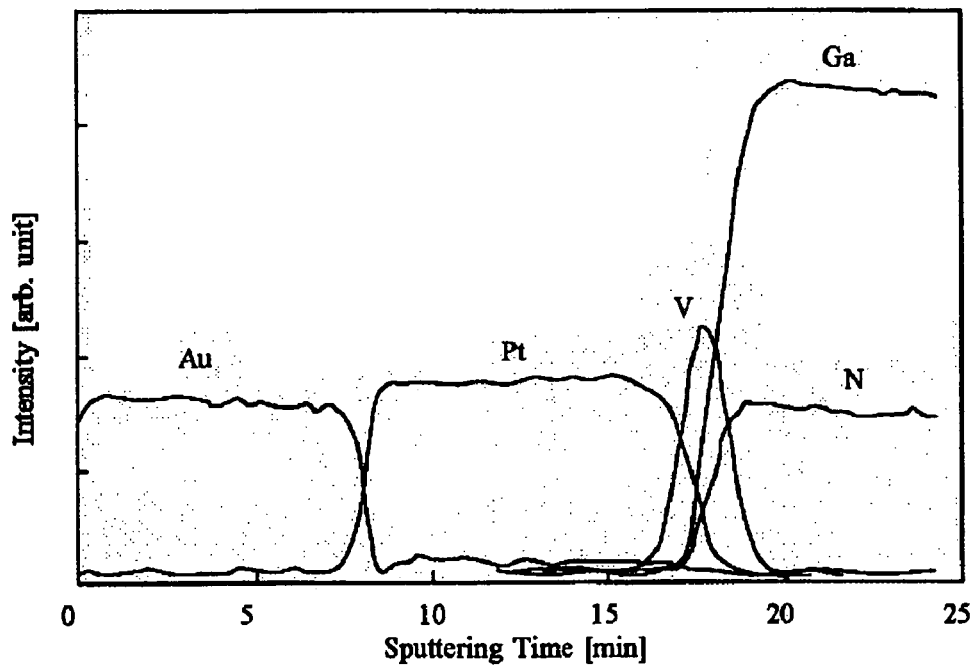
FIG. 12 is a graph showing the depth profile of the substrate by an Auger Electron Spectroscopy according to a comparative example of the present invention.

The obtained substrate (wafer) is measured in the same manner as in Example 1. FIGS. 7 and 9 show the measurement result of Auger electron spectroscopy on the substrate surface (polished surface), and FIG. 12 shows the measurement result of the elemental analysis in the thickness direction of the substrate having the electrode formed thereon. A tendency is observed that Si detected in Example 1 (FIG. 6) is not detected in FIG. 7, and by contrast, a larger amount of carbon (C) is detected in FIG. 7 than that in Example 1. It is observed in Ga-LMM shown in FIG. 9 that a part of Ga has been oxidized, as in Example 1. The depth profile shown in FIG. 12 is similar to that in Example 2.

Comparative Example 2 (Only $Cl_2$ is Used as the Active Spieces in the RIE Treatment of Example 1)

In Comparative Example 2, an electrode is formed on a substrate (the second main surface) in the same manner as in Example 1, except for setting the etching conditions as below.

Using the RIE machine, a second main surface of the substrate is etched by Ar gas at 300 W for 3 minutes, and by $Cl_2$ gas (active species) at 450 W for 4 minutes.

After the etching process, an n-side electrode is formed on an n-GaN:O substrate, in the same manner as in Example 1.

The results of measurement of the I-V characteristics (between the adjacent two electrodes) on five portions on the surface (the second main surface) of the substrate (wafer) performed in the same manner as in Example 1 show that many portions have Schottky contact. Although ohmic contact is observed in a portion, it is inferior to that of obtained in Examples 1 and 2. Further, by the observation of the substrate surface (the second main surface) after the etching process, a poor quality of the substrate surface is revealed, with a deteriorated surface partially containing visible residue, oxidation, and damage. Also, by the observation of the electrode after the electrode forming process, the electrode tends to deteriorate due to the effect of the features described above. The reliability of the devices using such substrates are inferior to the devices according to Examples and Reference Example 1.

INDUSTRIAL APPLICABILITY

According to the substrate electrode structure according to the present invention, an electrode capable of establishing superior ohmic contact is provided. Further, because the thermal stability at points of contact is excellent, a substrate with high thermal stability can be obtained. Thus, applications to various devices such as light emitting devices become possible. Further, according to the present invention, a non-alloy electrode can be formed which does not require a heat treatment to establish ohmic contact after the electrode forming process. Moreover, the electrode of the substrate can be disposed after the device structure is formed. Thus, the substrate electrode structures manufactured according to the present invention have advantages over conventional methods. The device structure according to the present invention can be applied widely to the transistors used in high temperature, high output, and high-frequency operation such as HEMT, light emitting devices such as LEDs and laser devices, and other semiconductor devices such as diodes.

It is to be understand that although the present invention has been described with regards to preferred embodiments thereof, various other embodiments and variants may occur to those skilled in the art, which are within the scope and spirit of the invention, and such other embodiments and variants are intended to be covered by the following claims.

This application is based on Japanese Patent Application No. 2004-045168 filed on Feb. 20, 2004, the contents of which are incorporated hereinto by reference.

What is claimed is:

1. A nitride semiconductor device comprising:
a substrate having an electrode disposed on a main surface of said substrate,
wherein said substrate is a nitride semiconductor substrate, said main surface of said substrate has a first region and a second region, said first region including a first n-type impurity, a concentration of said first n-type impurity in the first region is a higher concentration than a concentration of a second n-type impurity in the second region;
wherein said nitride semiconductor substrate includes said second n-type impurity in the second region that is chemically different than said first n-type impurity;
said second n-type impurity is oxygen;
a concentration of said second n-type impurity is distributed unevenly in said main surface; and
another main surface which is an opposite surface from said main surface includes a device structure comprising a plurality of stacked nitride semiconductor layers,
wherein the device structure on said another main surface is formed over both a high concentration region and a low concentration region of said second n-type impurity.

2. The nitride semiconductor device according to claim 1, wherein said nitride semiconductor substrate has n-type conductivity.

3. The nitride semiconductor device according to claim 1, wherein said first n-type impurity is silicon.

4. The nitride semiconductor device according to claim 3, wherein said electrode has a first layer in contact with said substrate, said first layer including at least one elemental metal selected from the group consisting of vanadium (V), tungsten (W), molybdenum (Mo), chromium (Cr), zirconium (Zr), niobium (Nb), hafnium (Hf), tantalum (Ta), and titanium (Ti).

5. The nitride semiconductor device according to claim 4, wherein said electrode further includes a second layer on said first layer, wherein said second layer is thicker than said first layer, and includes at least one elemental metal which is different than the elemental metal in said first layer and is selected from the group consisting of aluminum (Al), tungsten (W), molybdenum (Mo), platinum (Pt), palladium (Pd), rhodium (Rh), ruthenium (Ru), osmium (Os), and Iridium (Ir).

6. The nitride semiconductor device according to claim 1, wherein said electrode is grown on an N-polarity surface.

7. The nitride semiconductor device according to claim 1, wherein said substrate includes crystal defects, and said electrode is disposed at a low defect density region of the main surface of said substrate.

8. The nitride semiconductor device according to claim 1, wherein said electrode is a n-side electrode; said nitride semiconductor device is a light emitting device and has a plurality of nitride semiconductor layers including an n-side nitride semiconductor layer including an n-type nitride semiconductor layer and a p-side nitride semiconductor layer including a p-type nitride semiconductor layer; and a ridge portion is formed in said p-type nitride semiconductor layer and a p-side electrode is disposed on the ridge.

9. The nitride semiconductor device according to claim 1, wherein said electrode is a n-side electrode; said nitride semiconductor device is a light emitting device and has a plurality of nitride semiconductor layers including an n-side nitride semiconductor layer including an n-type nitride semiconductor layer and a p-side nitride semiconductor layer including a p-type nitride semiconductor layer; a p-side electrode is disposed on said p-side nitride semiconductor layer; and a n-side electrode is formed separately into a plurality of portions in a cross-sectional view of said substrate.

10. The nitride semiconductor device according to claim 1, wherein said electrode is disposed in a recess in the main surface.

11. The nitride semiconductor device according to claim 1, wherein said first n-type impurity is only disposed in the first region.

12. A nitride semiconductor device comprising:
a substrate having an electrode disposed on a main surface of said substrate,
wherein said substrate is a nitride semiconductor substrate, said main surface of said substrate has a first region and a second region, said first region including a first n-type impurity and a concentration of said first n-type impurity in the first region is a higher concentration than a concentration of a second n-type impurity in the second region and a concentration of said first n-type impurity in the first region of said main surface is higher than other areas in a depth direction of said substrate and wherein said electrode is disposed on a portion of the first region;
wherein said nitride semiconductor substrate includes said second n-type impurity in the second region that is chemically different than said first n-type impurity;
said second n-type impurity is oxygen;
a concentration of said second n-type impurity is distributed unevenly in said main surface; and
another main surface which is an opposite surface from said main surface includes a device structure comprising a plurality of stacked nitride semiconductor layers,
wherein the device structure on said another main surface is formed over both a high concentration region and a low concentration region of said second n-type impurity.

13. The nitride semiconductor device according to claim 12, wherein said electrode is only disposed on a portion of the first region.

14. The nitride semiconductor device according to claim 12, wherein said nitride semiconductor substrate has n-type conductivity.

15. The nitride semiconductor device according to claim 12, wherein said first n-type impurity is silicon.

16. The nitride semiconductor device according to claim 15, wherein said electrode has a first layer in contact with said substrate, said first layer including at least one elemental metal selected from the group consisting of vanadium (V), tungsten (W), molybdenum (Mo), chromium (Cr), zirconium (Zr), niobium (Nb), hafnium (Hf), tantalum (Ta), and titanium (Ti).

17. The nitride semiconductor device according to claim 16, wherein said electrode further includes a second layer on said first layer, wherein said second layer is thicker than said first layer, and includes at least one elemental metal which is different than the elemental metal in said first layer and is selected from the group consisting of aluminum (Al), tungsten (W), molybdenum (Mo), platinum (Pt), palladium (Pd), rhodium (Rh), ruthenium (Ru), osmium (Os), and Iridium (Ir).

18. The nitride semiconductor device according to claim 12, wherein said electrode is grown on an N-polarity surface.

19. The nitride semiconductor device according to claim 12, wherein said electrode is disposed in a recess in the main surface.

20. The nitride semiconductor device according to claim 12, wherein said substrate includes crystal defects, and said electrode is disposed at a low defect density region of the main surface of said substrate.

21. The nitride semiconductor device according to claim 12, wherein said electrode is a n-side electrode; said nitride semiconductor device is a light emitting device and has a plurality of nitride semiconductor layers including an n-side nitride semiconductor layer including an n-type nitride semiconductor layer and a p-side nitride semiconductor layer including a p-type nitride semiconductor layer; and a ridge portion is formed in said p-type nitride semiconductor layer and a p-side electrode is disposed on the ridge.

22. The nitride semiconductor device according to claim 12, wherein said electrode is a n-side electrode; said nitride semiconductor device is a light emitting device and has a plurality of nitride semiconductor layers including an n-side nitride semiconductor layer including an n-type nitride semiconductor layer and a p-side nitride semiconductor layer including a p-type nitride semiconductor layer; a p-side electrode is disposed on said p-side nitride semiconductor layer; and a n-side electrode is formed separately into a plurality of portions in a cross-sectional view of said substrate.

* * * * *